United States Patent
Jang et al.

(10) Patent No.: US 8,507,999 B2
(45) Date of Patent: Aug. 13, 2013

(54) SEMICONDUCTOR DEVICE, METHOD OF FABRICATING THE SAME, AND SEMICONDUCTOR MODULE AND ELECTRONIC SYSTEM INCLUDING THE SEMICONDUCTOR DEVICE

(75) Inventors: Hyeon-Woo Jang, Incheon (KR); Bong-Soo Kim, Seongnam-si (KR); Chae-Ho Lim, Seoul (KR); Hyo-Sun Min, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 128 days.

(21) Appl. No.: 13/175,038

(22) Filed: Jul. 1, 2011

(65) Prior Publication Data
US 2012/0001272 A1 Jan. 5, 2012

(30) Foreign Application Priority Data
Jul. 2, 2010 (KR) .......................... 10-2010-0064088

(51) Int. Cl.
*H01L 27/088* (2006.01)
(52) U.S. Cl.
USPC ..................................... 257/401; 257/E27.06
(58) Field of Classification Search
None
See application file for complete search history.

(56) References Cited

U.S. PATENT DOCUMENTS

| | | | | |
|---|---|---|---|---|
| 8,022,457 | B2 * | 9/2011 | Seo et al. | 257/305 |
| 8,283,714 | B2 * | 10/2012 | Seo et al. | 257/296 |
| 2005/0275042 | A1 * | 12/2005 | Hwang et al. | 257/401 |
| 2006/0071261 | A1 * | 4/2006 | Spitzer | 257/302 |
| 2007/0012996 | A1 * | 1/2007 | Yoon et al. | 257/329 |
| 2007/0152255 | A1 * | 7/2007 | Seo et al. | 257/302 |
| 2008/0073730 | A1 * | 3/2008 | Lee et al. | 257/401 |
| 2008/0121961 | A1 * | 5/2008 | Schloesser | 257/302 |
| 2009/0026552 | A1 * | 1/2009 | Zhang et al. | 257/401 |
| 2009/0039445 | A1 * | 2/2009 | Wu | 257/392 |
| 2009/0101970 | A1 * | 4/2009 | Kim et al. | 257/330 |
| 2009/0189217 | A1 * | 7/2009 | Yoon et al. | 257/329 |
| 2011/0186923 | A1 * | 8/2011 | Seo et al. | 257/330 |

FOREIGN PATENT DOCUMENTS

| | | |
|---|---|---|
| KR | 10-2004-0049121 A | 6/2004 |
| KR | 10-2009-0025784 A | 3/2009 |
| KR | 10-2009-0037251 A | 4/2009 |

* cited by examiner

*Primary Examiner* — Thomas L Dickey
*Assistant Examiner* — Joseph Schoenholtz
(74) *Attorney, Agent, or Firm* — Lee & Morse, P.C.

(57) ABSTRACT

A semiconductor device includes a substrate including a cell area and a peripheral area, the cell area having an active region defined by an isolation region, a cell gate structure below an upper surface of the substrate in the cell area, the cell gate crossing the active region, a bit line structure above an upper surface of the substrate in the cell area, the bit line structure including bit line offset spacers on at least two side surfaces thereof, and a peripheral gate structure above an upper surface of the substrate in the peripheral area, the peripheral gate structure including peripheral gate offset spacers and peripheral gate spacers on at least two side surfaces thereof.

19 Claims, 25 Drawing Sheets

FIG. 1
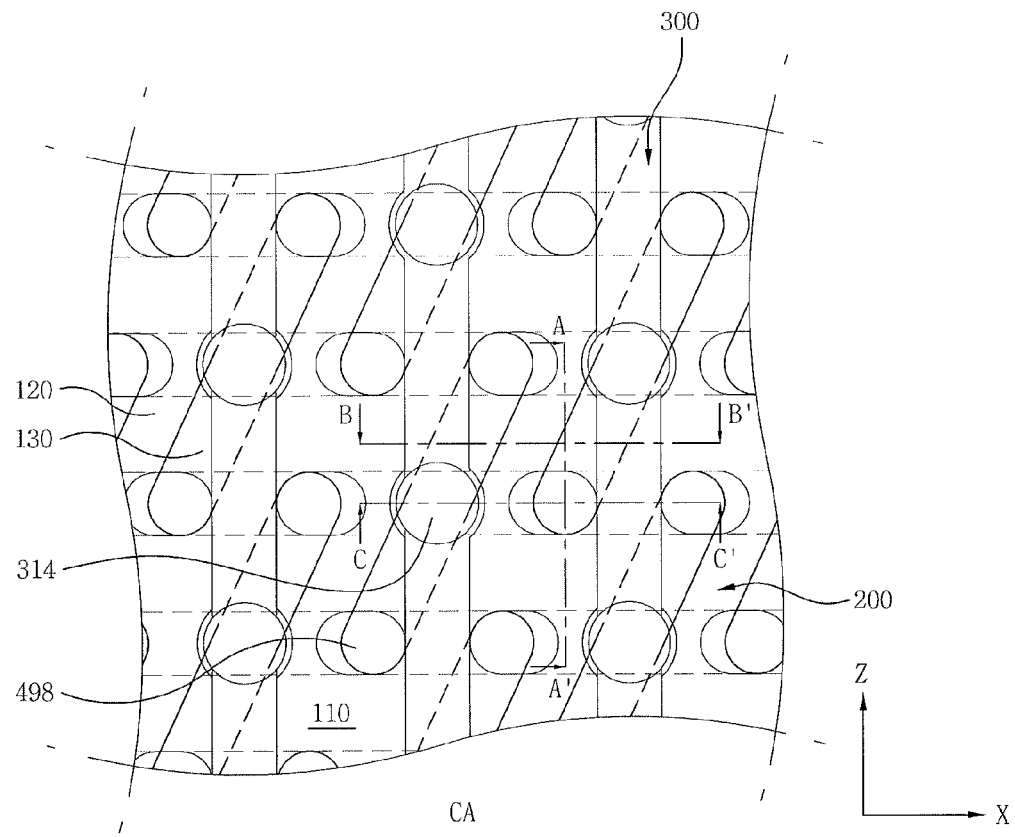
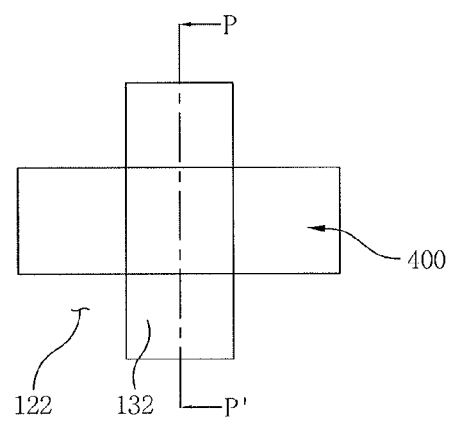

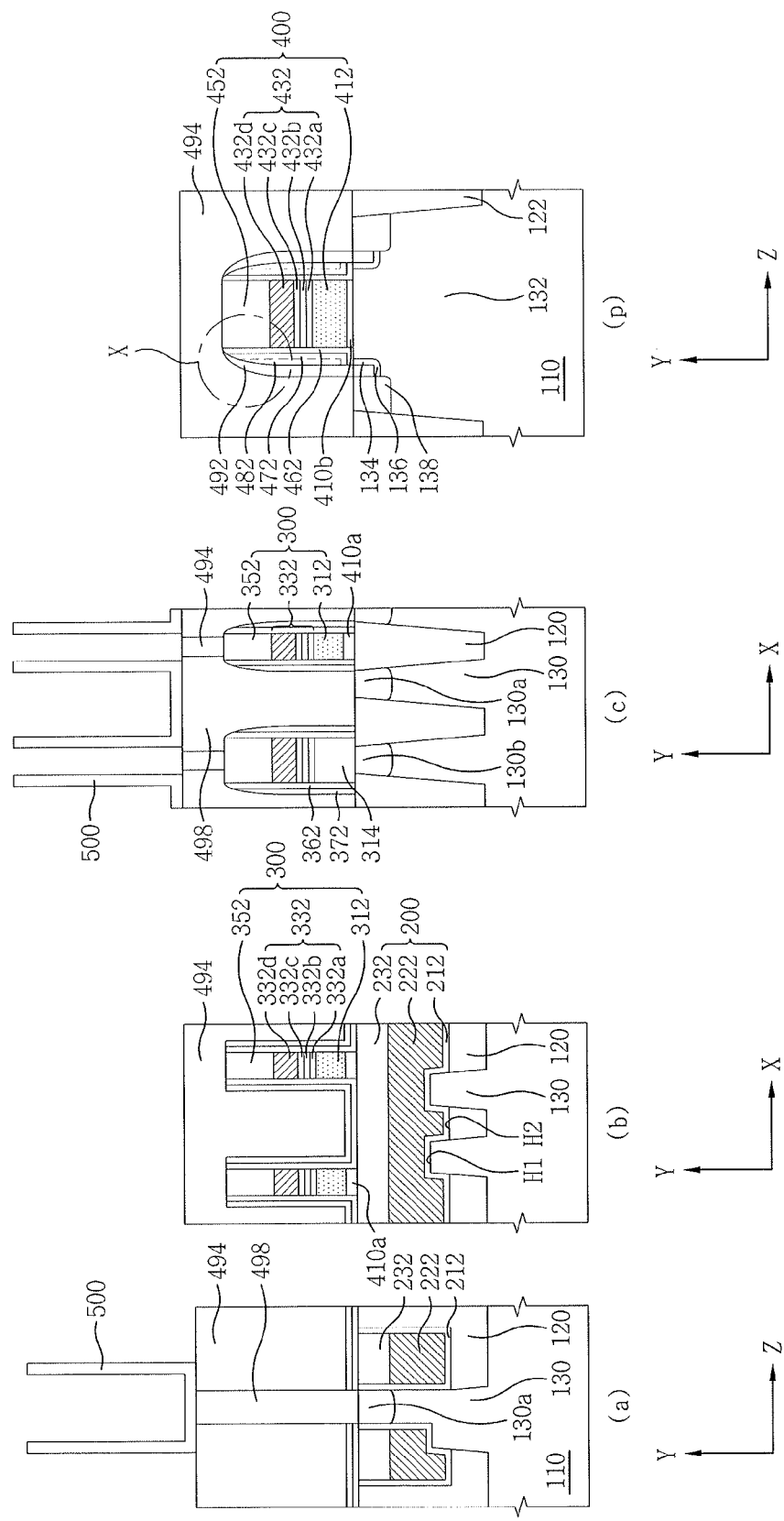

SEMICONDUCTOR DEVICE, METHOD OF FABRICATING THE SAME, AND SEMICONDUCTOR MODULE AND ELECTRONIC SYSTEM INCLUDING THE SEMICONDUCTOR DEVICE

CROSS-REFERENCE TO RELATED APPLICATION

This application claims priority under 35 U.S.C. §119 to Korean Patent Application No. 10-2010-0064088, filed on Jul. 2, 2010, in the Korean Intellectual Property Office, the disclosure of which is hereby incorporated by reference in its entirety.

BACKGROUND

1. Field

Embodiments of the inventive concept relate to a semiconductor device and a method of fabricating the same, and more particularly, to a semiconductor device including a cell bit line structure and a peripheral gate structure, which are formed at the same level but have different spacer thicknesses from each other, a method of fabricating the same, and a semiconductor module and electronic system including the same.

2. Description of the Related Art

While semiconductor devices are becoming highly integrated, the structure thereof is also becoming more elaborate. Thus, a process of fabricating the semiconductor devices is becoming more complicated. Accordingly, techniques proposed according to this trend include a buried channel array transistor (BCAT) technique, a $8F^2$ layout technique, etc.

SUMMARY

Embodiments of the inventive concept provide a semiconductor device including a cell bit line and a peripheral gate, which are formed at the same level but have different spacer thicknesses.

Embodiments of the inventive concept also provide a semiconductor module including a semiconductor device with a cell bit line and a peripheral gate, which are formed at the same level but have different spacer thicknesses.

Embodiments of the inventive concept also provide an electronic system including a semiconductor device or a semiconductor module with a cell bit line and a peripheral gate, which are formed at the same level but have different spacer thicknesses.

Embodiments of the inventive concept also provide various methods of fabricating the semiconductor device.

In accordance with an aspect of the inventive concept, a semiconductor device includes a substrate including a cell area and a peripheral area, the cell area having an active region defined by an isolation region, a cell gate structure below an upper surface of the substrate in the cell area, the cell gate crossing the active region, a bit line structure above an upper surface of the substrate in the cell area, the bit line structure including bit line offset spacers on at least two side surfaces thereof, and a peripheral gate structure above an upper surface of the substrate in the peripheral area, the peripheral gate structure including peripheral gate offset spacers and peripheral gate spacers on at least two side surfaces thereof.

The peripheral gate offset spacer may be at least twice thicker than the bit line offset spacer.

Each of the bit line offset spacer and the peripheral gate offset spacer may include a silicon nitride (SiN) layer or a silicon oxynitride (SiON) layer, and the peripheral gate spacer includes a silicon oxide layer.

The bit line structure may include a first bit line conductive pattern, a second bit line conductive pattern, and a bit line hard mask pattern, and the peripheral gate structure may include a first peripheral gate conductive pattern, a second peripheral gate conductive pattern, and a peripheral gate hard mask pattern, the first bit line conductive pattern, the second bit line conductive pattern, and the bit line hard mask pattern including substantially the same materials to substantially the same thicknesses at substantially the same levels as the first peripheral gate conductive pattern, the second peripheral gate conductive pattern, and the peripheral gate hard mask pattern, respectively.

Each of the first bit line conductive pattern and the first peripheral gate conductive pattern may include a doped silicon layer, each of the second bit line conductive pattern and the second peripheral gate conductive pattern may include a metal layer, and each of the bit line hard mask pattern and the peripheral gate hard mask pattern may include a silicon nitride layer.

The second bit line conductive pattern may include a bit line electrode pattern, and the second peripheral gate conductive pattern includes a peripheral gate electrode pattern.

The second bit line conductive pattern may further include a lower bit line metal silicide pattern, a bit line barrier pattern, and an upper bit line metal silicide pattern between the first bit line conductive pattern and the bit line electrode pattern, and the second peripheral gate conductive pattern may further include a lower peripheral gate metal silicide pattern, a peripheral gate barrier pattern, and an upper peripheral gate metal silicide pattern between the first peripheral gate conductive pattern and the peripheral gate electrode pattern.

In accordance with another aspect of the inventive concept, a semiconductor device includes a substrate including a cell area and a peripheral area, the cell area having a plurality of cell active regions defined by cell isolation regions, and the peripheral area having a peripheral active region defined by a peripheral isolation region, a bit line structure in the cell area of the substrate, a peripheral gate structure in the peripheral area of the substrate, first bit line offset spacers on at least two sides of the bit line structure, first peripheral gate offset spacers on at least two sides of the peripheral gate structure, second peripheral gate offset spacers on the at least two sides of the peripheral gate structure, and peripheral gate spacers on the at least two sides of the peripheral gate structure.

Each of the first peripheral gate offset spacer and the second peripheral gate offset spacer may include a silicon nitride-based layer, and the peripheral gate spacer includes a silicon oxide-based layer.

A sum of thicknesses of the first peripheral gate offset spacer and the second peripheral gate offset spacer may be substantially uniform, and a thickness ratio of the first peripheral gate offset spacer to the second peripheral gate offset spacer is variable.

A thickness of the first peripheral gate offset spacer may be determined in accordance with a thickness of the first bit line offset spacer.

A thickness of the first bit line offset spacer may be about 10 Å to about 60 Å.

A thickness of the second peripheral gate offset spacer may be about 60 Å to about 110 Å.

The bit line structure may include a first bit line conductive pattern, a second bit line conductive pattern, and a bit line hard mask pattern, the second bit line conductive pattern including sequentially stacked a lower bit line metal silicide pattern, a bit line barrier pattern, an upper bit line metal silicide pattern, and a bit line electrode pattern, and the peripheral gate structure may include a first peripheral gate conductive pattern, a second peripheral gate conductive pattern, and a peripheral gate hard mask pattern, the second peripheral gate conductive pattern including sequentially stacked a lower peripheral gate metal silicide pattern, a peripheral gate barrier pattern, an upper peripheral gate metal silicide pattern, and a peripheral gate electrode pattern.

The lower bit line metal silicide pattern, the bit line barrier pattern, the upper bit line metal silicide pattern, and the bit line electrode pattern may include substantially the same materials to substantially the same thicknesses at substantially the same levels as the lower peripheral gate metal silicide pattern, the peripheral gate barrier pattern, the upper peripheral gate metal silicide pattern, and the peripheral gate electrode pattern, respectively.

In accordance with another aspect of the inventive concept, a semiconductor device includes a substrate including a cell area and a peripheral area, a bit line structure in the cell area, the bit line structure including first external sidewalls, and a bit line spacer on the first external sidewalls, and a peripheral gate structure in the peripheral area, the peripheral gate structure including second external sidewalls, and a peripheral spacer on the second external sidewalls, the peripheral spacer being thicker than the bit line spacer.

The bit line spacer may include a first surface contacting the first external sidewall of the bit line structure and a second surface contacting an interlayer insulating layer covering the bit line structure, the peripheral spacer may include a first surface contacting the second external sidewall of the peripheral gate structure and a second surface contacting an interlayer insulating layer covering the peripheral gate structure, and a thickness of each of the bit line and peripheral spacers may be measured between respective first and second surfaces.

The device may further include an insulating layer on the substrate, a bottom of the peripheral gate structure and a bottom of the bit line structure being directly on the insulating layer, and the peripheral gate structure and the bit line structure extending in a same direction.

The peripheral spacer may include more spacer layers than the bit line spacer.

The bit line spacer may include at least a first spacer layer and a second spacer layer, the peripheral spacer may include at least a first spacer layer, a second spacer layer, and a third spacer layer, and a sum of thicknesses of the second and third spacer layers of the peripheral spacer is at least twice as thick as a thickness of the second spacer layer of the bit lines spacer.

BRIEF DESCRIPTION OF THE DRAWINGS

The above and other features and advantages will become more apparent to those of ordinary skill in the art by describing in detail exemplary embodiments with reference to the attached drawings, in which:

FIG. 1 illustrates a schematic layout of a semiconductor device according to the inventive concept;

FIG. 2A illustrates vertical cross-sectional views taken along lines A-A', B-B', C-C', and P-P' of FIG. 1;

DETAILED DESCRIPTION

Figure 2B:
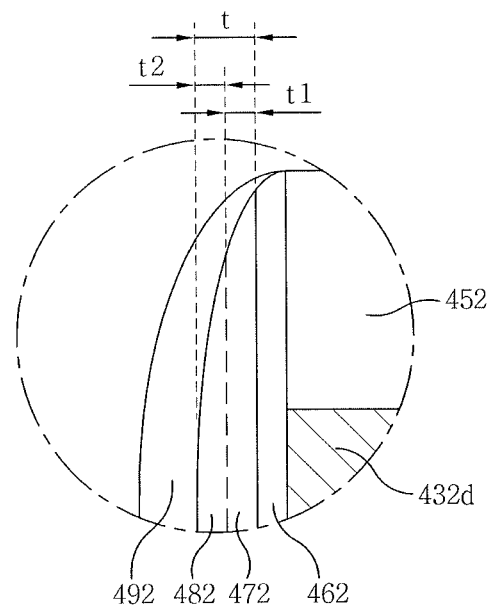
FIGS. 2B and 2C illustrate vertical cross-sectional views of an enlarged part X of various semiconductor devices of FIG. 2A according to embodiments of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to," or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic layout of a semiconductor device according to the inventive concept. In FIG. 2A, (a), (b) and (c) are vertical cross-sectional views taken along lines A-A', B-B', and C-C' of FIG. 1, respectively, and (p) is a vertical cross-sectional view taken along line P-P' of FIG. 1.

Referring to FIGS. 1 and 2A, the semiconductor device may include a substrate 110 having a cell area CA and a peripheral area PA.

The cell area CA may include a plurality of cells, each cell including one cell gate structure 200 and one storage electrode 500. For example, a plurality of cell transistors and a plurality of cell capacitors may be regularly formed in the cell area CA. Thus, the cell area CA may include cell isolation regions 120, cell active regions 130, and cell gate structures 200, which are formed below the substrate 110, e.g., below an upper surface 110a (FIG. 3G) of the substrate 110, and bit line structures 300 and storage electrodes 500, which are formed above the substrate 110, e.g., above the upper surface 110a of the substrate 110.

The peripheral area PA may include a peripheral gate structure 400 performing read and write functions to store data in the cell. For example, a CMOS transistor constituting a logic circuit may be formed in the peripheral area PA. Thus, the peripheral area PA may include a peripheral isolation region 122 and a peripheral active region 132, which are formed below the substrate 110, and a peripheral gate structure 400, which is formed above the substrate 110, i.e., at a same level as the bit line structures 300.

The cell gate structure 200 in the cell region CA may include a recessed channel aligned perpendicularly to the substrate 110. The peripheral gate structure 400 in the peripheral area PA may include a planar channel.

For example, the cell gate structure 200 in the cell area CA may include a recessed channel, which serves to prevent a short channeling effect. The cell gate structure 200 in the cell area CA may be buried in the substrate 110.

The cell gate structure 200 in the cell area CA may include a cell gate insulating layer 212, a cell gate conductive pattern 222, and a cell gate capping pattern 232, which are stacked in a trench for burying a gate in the cell active region 130. Here, since an upper surface level H1 of the cell active region 130 disposed below the cell gate conductive pattern 232 is higher than an upper surface level H2 of the cell isolation region 120 disposed below the cell gate conductive pattern 232, the cell gate structure 200 may be formed as a transistor in a pin FET structure having the projecting cell active region 130.

In the cell area CA, the cell active region 130 defined by the cell isolation region 120 may be repeatedly aligned at regular intervals. The cell active region 130 may include a cell source area 130a and a cell drain area 130b in partial regions of the substrate 110. The cell active regions 130 may be disposed to have a tilt between a first direction, e.g., the x-axis, and a second direction of the substrate 110, e.g., the z-axis. The cell gate structures 200 may be extended in the first direction, and the bit line structures 300 may be extended in the second direction. The first direction may be substantially perpendicular to the second direction. In each cell active region 130, two lines of the gate structures 200 may cross one line of the bit line structure 300. The cell active region 130 may be inclined toward the cell gate structure 200 and the bit line structure 300 at a predetermined angle.

The cell gate structure 200 and the bit line structures 300 may cross at right angles to minimize the cell area. Here, while the cell active region 130 is defined as a bar type by the cell isolation region 120, it may be inclined toward the cell gate structure 200 and the bit line structures 300 at an angle.

The bit line structure 300 may include a first bit line conductive pattern 312, a second bit line conductive pattern 332, and a bit line hard mask pattern 352. The first bit line conductive pattern 312 may be formed of, e.g., doped silicon having conductivity, metal or a metal compound. The second bit line conductive pattern 332 may be formed of, e.g., metal or a metal compound. The bit line hard mask pattern 352 may be formed of, e.g., silicon nitride having insulation performance.

The second bit line conductive pattern 332 may include a bit line electrode pattern 332d. When the bit line electrode pattern 332d is formed of a metal compound, and the first bit line conductive pattern 312 is formed of doped silicon, the bit line structure 300 may further include a lower bit line metal silicide pattern 332a, a bit line barrier pattern 332b, and an upper bit line metal silicide pattern 332c on the first bit line conductive pattern 312. The lower bit line metal silicide pattern 332a may include a metal layer or a metal silicide material, for example, a material having both metal and metal silicide. The bit line barrier pattern 332b may be formed of, e.g., titanium nitride (TiN). The upper bit line metal silicide pattern 332c may be formed of, e.g., metal silicide or metal nitride. For example, the bit line electrode pattern 332d may be formed of the same metal as the upper bit line metal silicide pattern 332c.

The bit line structure 300 may further include a bit line contact plug 314 in a bit line contact area electrically or physically connecting the second bit line conductive pattern 332 to the cell drain area 130b. The bit line contact plug 314 may be formed of, e.g., doped silicon, like the first bit line conductive pattern 312. However, the first bit line conductive pattern 312 may further include carbon. The second bit line conductive pattern 332 may perform the function of a bit line electrode as an interconnection. The bit line hard mask pattern 352 may serve as a bit line capping layer protecting the second bit line conductive pattern 332.

The bit line structure 300 may have at least two kinds of widths in accordance with the region. For example, the bit line structure 300 may have a great width in the bit line contact area including the bit line contact plug 314. Thus, the bit line structure 300 in direct contact with the cell drain area 130b may have a tab structure, and thus have a greater width than the bit line structure 300 not in contact with the cell drain region 130b. As described above, the bit line structure 300 having the tab structure may have the bit line contact plugs 314.

The peripheral gate structure 400 may include a peripheral gate insulating layer 410b, a first peripheral gate conductive pattern 412, a second peripheral gate conductive pattern 432, and a peripheral gate hard mask pattern 452. The peripheral gate insulating layer 410b may be formed of, e.g., silicon oxide. For example, the peripheral gate insulating layer 410b may be formed of the same material and by the same process as a first insulating layer 410a. However, the peripheral gate insulating layer 410b may have a different thickness from that of the first insulating layer 410a. The peripheral gate structure 400 may be formed by the same process as the bit line structure 300. Accordingly, the first peripheral gate conductive pattern 412, the second peripheral gate conductive pattern 432, and the peripheral gate hard mask pattern 452 may be formed of the same materials and/or to the same thicknesses at the same or similar levels as the first bit line conductive pattern 312, the second bit line conductive pattern 332, and the bit line hard mask pattern 352. For example, a bottom 300b (FIG. 3G) of the bit line structure 300 and a bottom 400b (FIG. 3G) of the peripheral gate structure 400 may be at a substantially same level, i.e., formed directly on a same element.

When the second bit line conductive pattern 332 includes the lower bit line metal silicide pattern 332a, the bit line barrier pattern 332b, and the upper bit line metal silicide pattern 332c, as well as the bit line electrode pattern 332d, the second peripheral gate conductive pattern 432 may include a lower peripheral gate metal silicide pattern 432a, a peripheral gate barrier pattern 432b, and an upper bit line metal silicide pattern 432c, as well as a peripheral gate electrode pattern 432d. Here, the lower peripheral gate metal silicide pattern 432a, the peripheral gate barrier pattern 432b, the upper bit line metal silicide pattern 432c, and the peripheral gate electrode pattern 432d may be formed of the same materials and/or to the same thicknesses at the same or similar levels as the lower bit line metal silicide pattern 332a, the bit line barrier pattern 332b, the upper bit line metal silicide pattern 332c, and the bit line electrode pattern 332d.

Figure 3A:
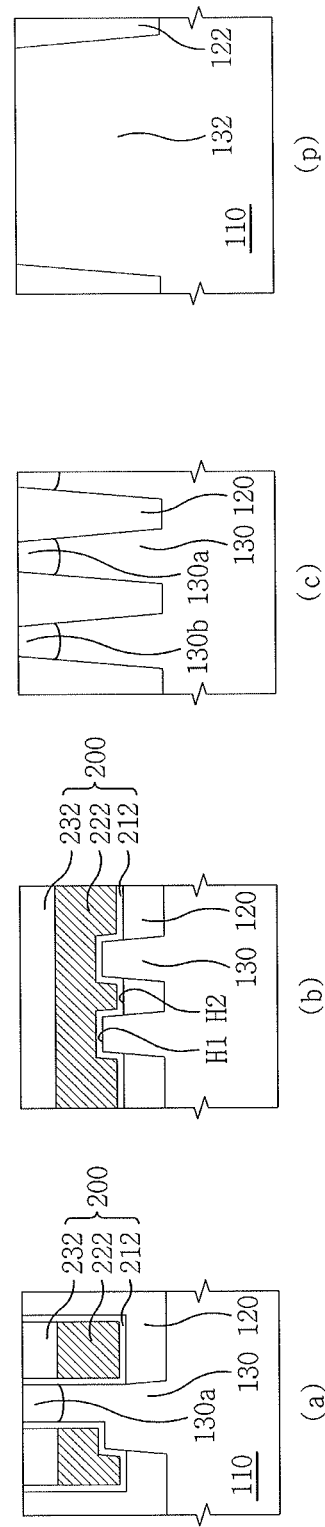
FIGS. 3A to 3S illustrate vertical cross-sectional views of stages in a method of fabricating a semiconductor device according to the inventive concept.
Figure 3B:
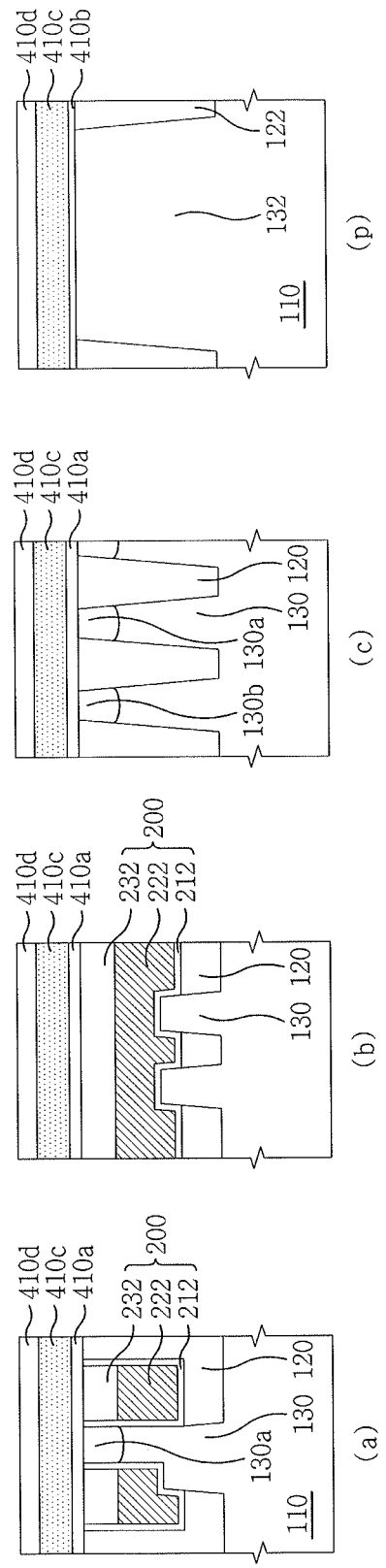
FIGS. 3T and 3U illustrate vertical cross-sectional views of an enlarged part Y of FIG. 3J to illustrate various methods of fabricating a semiconductor device.
Figure 3C:
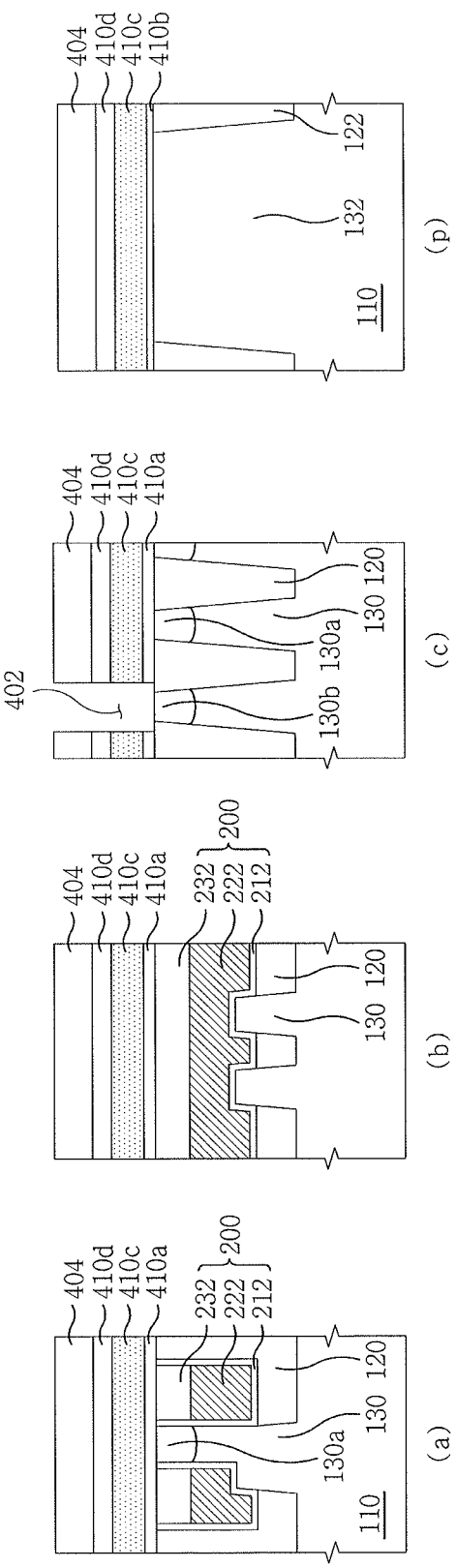
Figure 3D:
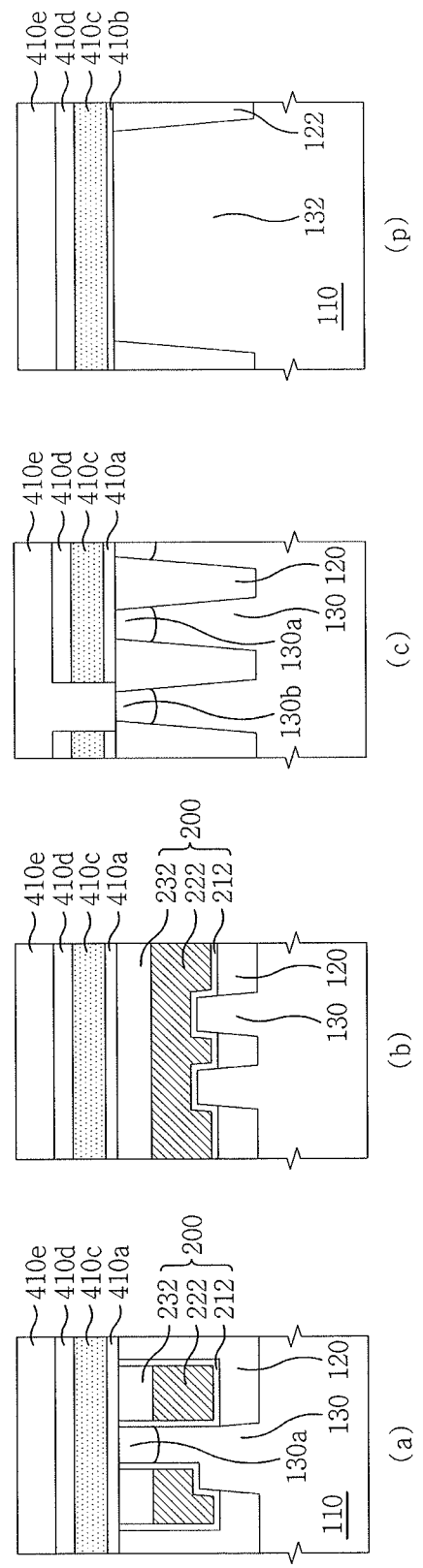
Figure 3E:
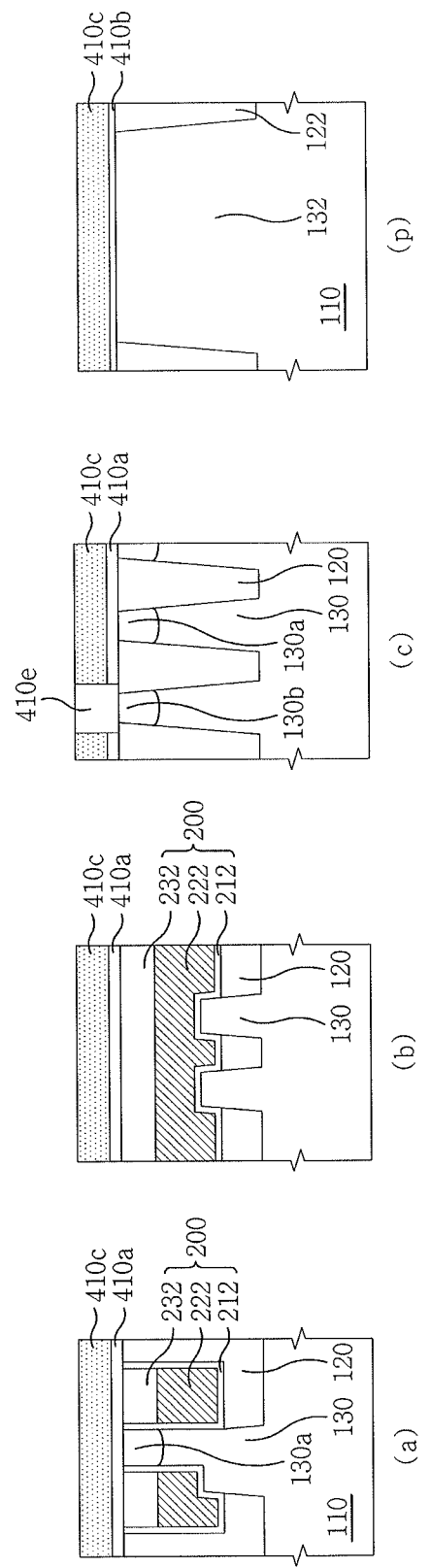
Figure 3F:
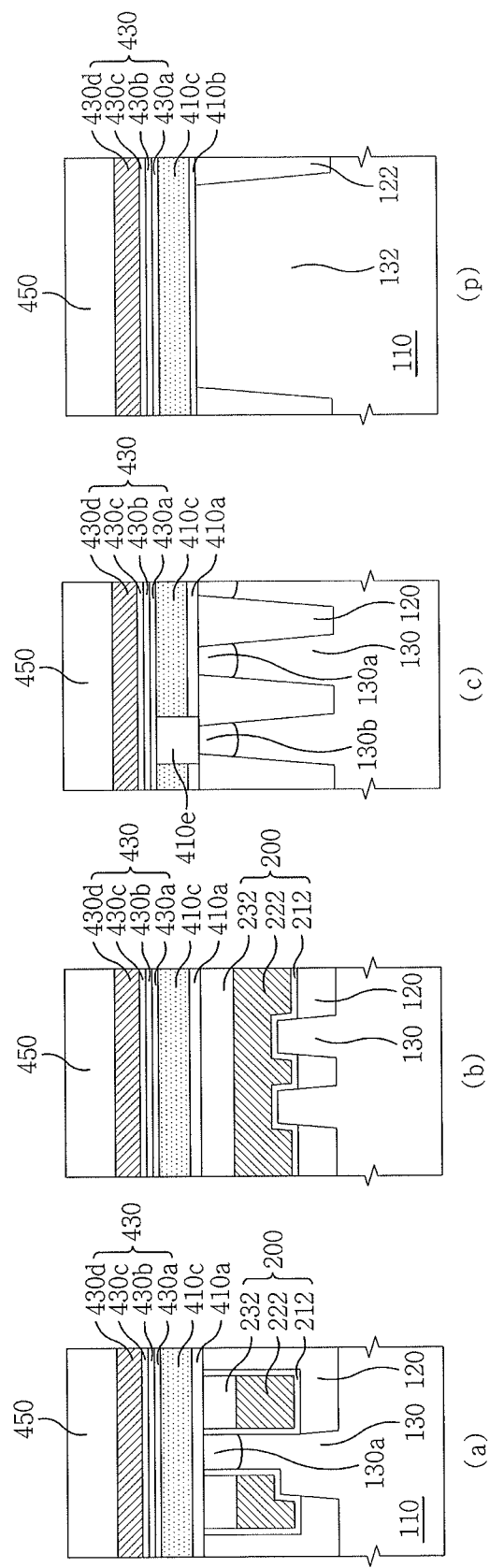
Figure 3G:
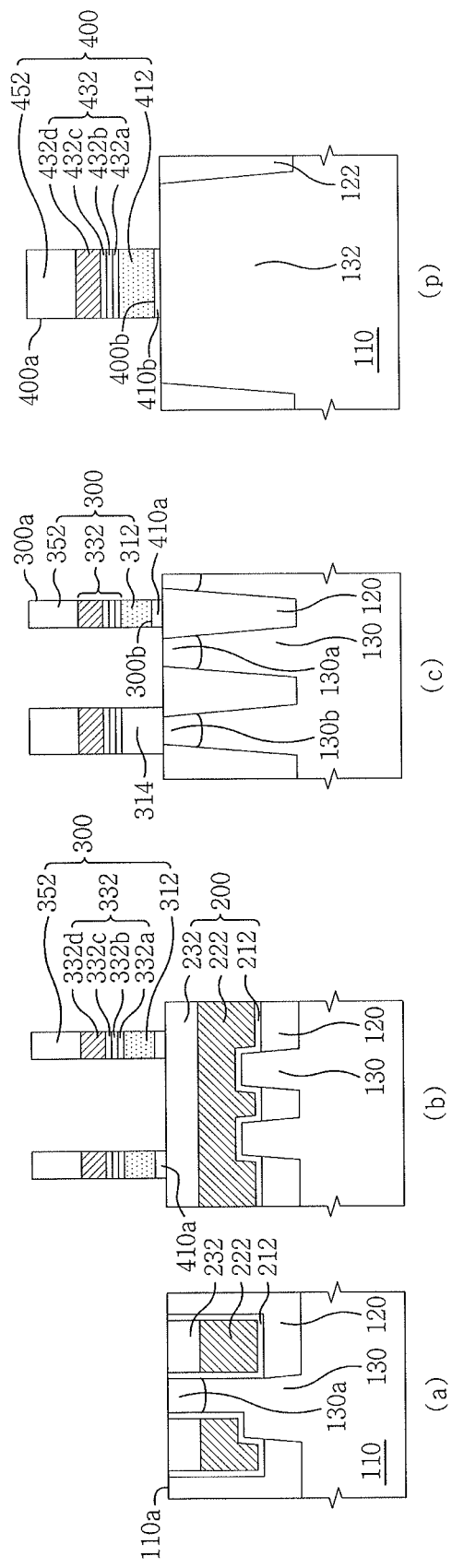

The bit line structure 300 may include a bit line lapping layer on both sides and/or an upper surface thereof, e.g., the bit line structure 300 may include a bit line lapping layer on each lateral sidewall 300a thereof (FIG. 3G). For example, the bit line lapping layer may include a bit line protective spacer 362 and a first bit line offset spacer 372 on each side of the bit line structure 300.

The peripheral gate structure 400 may include a peripheral gate lapping layer on both sides and/or an upper surface thereof, e.g., the peripheral gate structure 400 may include a peripheral gate lapping layer on each lateral sidewall 400a thereof (FIG. 3G). For example, the peripheral gate lapping layer may include a peripheral gate protective spacer 462, a first peripheral gate offset spacer 472, and a second peripheral gate offset spacer 482 on each side of the peripheral gate structure 400. Further, the peripheral gate structure 400 may include a peripheral gate spacer 492 on the peripheral gate lapping layer, i.e., on the second peripheral gate offset spacer 482. The first and second peripheral gate offset spacers 472 and 482 may serve as a low concentration and/or hollow ion implantation mask. The peripheral gate spacer 492 may serve as a high concentration ion implantation mask.

Since the peripheral gate lapping layer includes more layers than the bit line lapping layer, e.g., the peripheral gate lapping layer further includes at least the second peripheral gate offset spacer 482, the peripheral gate lapping layer may be thicker than the bit line lapping layer. The first bit line offset spacer 372 may be formed to have a minimal thickness to improve a parasitic capacitance (CBL) characteristic, and the second peripheral gate offset spacer 482 may be formed to a maximal thickness to improve a short channel effect. Thus, the peripheral gate lapping layer may be at least twice as thick as the bit line lapping layer. It is noted that the thickness of the bit line lapping layer may be measured between a first surface 362a, i.e., a surface contacting the lateral wall 300a of the bit line structure 300, and a second surface 372a, i.e., a surface contacting a storage contact 498 (see FIG. 3S). Similarly, the thickness of the peripheral lapping layer may be measured between a first surface 462a, i.e., a surface contacting the lateral wall 400a of the peripheral gate structure 400, and a second surface 482a, i.e., a surface contacting the peripheral gate spacer 492.

Figure 2C:
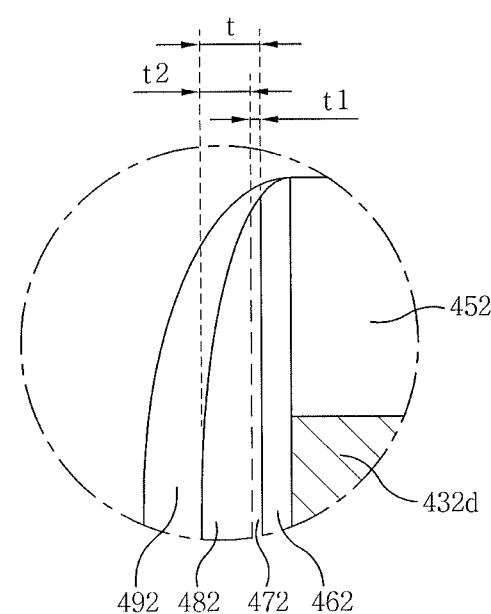

The thickness of the peripheral gate lapping layer will be described in more detail below with reference to FIGS. 2B and 2C. FIGS. 2B and 2C are enlarged vertical cross-sectional views of part X in FIG. 2A.

Referring to FIGS. 2B and 2C, the sum of a thickness t1 of the first peripheral gate offset spacer 472 and a thickness t2 of the second peripheral gate offset spacer 482, i.e., a total thickness t, may be uniform because of the characteristics of the CMOS transistor. However, a ratio of the thickness t1 of the first peripheral gate offset spacer 472 to the thickness t2 of the second peripheral gate offset spacer 482 may not be uniform, i.e., may be variable. In detail, since the first peripheral gate offset spacer 472 and the first bit line offset spacer 372 are formed by the same process, their thicknesses are formed to be equal or substantially equal, e.g., both the first peripheral gate offset spacer 472 and the first bit line offset spacer 372 are formed to have the thickness t1. As the thickness of the first bit line offset spacer 372, i.e., a thickness that equals t1, is adjusted to improve the parasitic capacitance (CBL) characteristic, the thickness of the first peripheral gate offset spacer 472 is predetermined in accordance with the thickness of the first bit line offset spacer 372, i.e., to have the thickness t1. Thus, as the sum of the thicknesses t1 and t2 is uniform, the thickness t2 of the second peripheral gate offset spacer 482 may be adjusted in accordance with the value of the thickness t1, such that the thickness t2 may be greater than or equal to the thickness t1 of the first peripheral gate offset spacer 472 (or the thickness t1 of the first bit line offset spacer 372), i.e., t1 t2. In other words, while t remains constant, thickness t2 may equal thickness t1 (see FIG. 2B) or may be larger than thickness t1 (see FIG. 2C).

For example, to improve the short channel effect occurring due to the characteristics of the transistor, a total thickness t of the first peripheral gate offset spacer 472 and the second peripheral gate offset spacer 482, i.e., t1+t2=t, may be about 120 Å or more. In such conditions, the thickness ratio of the first peripheral gate offset spacer 472 to the second peripheral gate offset spacer 482 is variable, and may be determined by the thickness (equal to t1) of the first bit line offset spacer 372. For example, when the thickness (equal to t1) of the first bit line offset spacer 372 is about 10 Å to 60 Å, the thickness t2 of the second peripheral gate offset spacer 482 may be determined to have a range of about 60 Å to about 110 Å. It is noted that a thickness of the first bit line offset spacer 372 below 10 Å may be insufficient to protect the bit line structure 300, while a thickness of the first bit line offset spacer 372 above 60 Å may increase parasitic capacitance (CBL).

Referring back to FIG. 2A, the peripheral gate structure 400 may be a CMOS transistor. Thus, the peripheral active region 132 may include various types of impurity areas.

The peripheral active region 132 may include a low concentration impurity area 134 as a part of the substrate 110. When the peripheral gate structure 400 is a PMOS transistor, the low concentration impurity area 134 may be P-type. When the peripheral gate structure 400 is an NMOS transistor, the low concentration impurity area 134 may be N-type.

The peripheral active region 132 may further include a hollow area 136 surrounding the low concentration impurity area 134 or disposed between the low concentration impurity area 134 and a channel area. When the peripheral gate structure 400 is a PMOS transistor, the hollow area 136 may be N-type. When the peripheral gate structure 400 is an NMOS transistor, the hollow area 136 may be P-type.

The peripheral active region 132 may further include a high concentration impurity area 138 opposite to the hollow area 136 as a part of the substrate 110. When the peripheral gate structure 400 is a PMOS transistor, the high concentration impurity area 138 may be P-type. When the peripheral gate structure 400 is an NMOS transistor, the high concentration impurity area 138 may be N-type.

The semiconductor device may further include an interlayer insulating layer 494, the storage contact (BC) 498, and a storage electrode 500. The storage contact 498 may be formed between the storage electrode 500 and the cell source area 130a to electrically connect the storage electrode 500 and the cell source area 130a.

A method of fabricating the semiconductor device having such a configuration will be described in detail with reference to FIGS. 3A to 3S. FIGS. 3A to 3S are vertical cross-sectional views illustrating stages in a method of fabricating a semiconductor device according to the inventive concept. Each drawing shows a cross-section taken along lines A-A', B-B', C-C', and P-P' of FIG. 1.

First, referring to FIGS. 1 and 3A, a process of forming a buried transistor may be performed on the substrate 110 in the cell area CA. Before the process, isolation may be performed on the entire surface of the substrate 110 including the cell area CA and the peripheral area PA. A trench for isolation (not shown) may be formed in the substrate 110 by shallow trench isolation (STI). The trench isolation may be filled with an insulating material, thereby forming the cell isolation region 120 defining the cell active region 130 and the peripheral isolation region 122 defining the peripheral active region 132 in the cell area CA and the peripheral area PA, respectively. The substrate 110 may be formed, e.g., of single crystalline silicon or silicon germanium. The insulating material may be composed of, e.g., BPSG, USG or HDP oxide, which is capable of insulating devices. The cell active region 130 may be formed, e.g., in a form of a bar-shaped island having a length greater than its width. The cell isolation region 120 may define the cell active region 130.

Subsequently, a process of burying a gate may be performed on the substrate 110 in the cell area CA. First, a trench for burying a gate (not shown) may be formed in the cell area CA by a recess process. Due to the recessing, the cell active region 130 and the cell isolation region 120 may be partially removed. Here, the cell isolation region 120 may be more removed than the cell active region 130, and thus the upper surface level H2 of the cell isolation region 120 may be located at a lower level than the upper surface level H1 of the cell active region 130. Thus, a pin structure in which the cell active region 130 projects may be formed.

The cell gate insulating layer 212 may be formed in the trench for burying a gate, e.g., by CVD or thermal oxidation. A gate conductive layer (not shown) filling the trench for burying a gate may be formed on the cell gate insulating layer 212, e.g., by PVD or sputtering. The cell gate conductive pattern 222 may be formed by partially removing the gate conductive layer, e.g., by CMP and/or etch back. An upper surface level of the cell gate conductive pattern 222 may be lower than an upper surface level of the substrate 110.

A cell gate capping layer (not shown) protecting the cell gate conductive pattern 222 may be formed on the exposed cell gate pattern 222. Then, a cell gate capping pattern 232 may be formed by partially removing the cell gate capping layer, e.g., by CMP and/or etch back, until the upper surface of the substrate 110 is exposed. The cell gate insulating layer 212 may be formed of, e.g., a silicon oxide layer. The cell gate conductive pattern 222 may be formed of, e.g., a doped polysilicon layer, a metal layer, or a metal compound layer. The cell gate capping pattern 232 may be formed of, e.g., a silicon oxide layer. The cell gate structure 200 including the cell gate conductive pattern 222 and the cell gate capping pattern 232 may serve as a word line WL.

The cell source area 130a and a cell drain area 130b may be formed by ion implantation, so a buried transistor including the cell gate insulating layer 212, the cell gate conductive pattern 222, the cell gate capping pattern 232, and the cell source/drain areas 130a and 130b may be completed. Here, the ion implantation may be performed on the cell area CA using the gate electrode 240 and the isolation region 220 as ion implantation masks. Alternatively, before the cell gate structure 200 is formed, the ion implantation may be performed.

Referring to FIG. 3B, the first insulating layer 410a may be formed on the entire surface of the substrate 110 in the cell area CA. The peripheral gate insulating layer 410b may be formed in the peripheral area PA to have a smaller thickness than the first insulating layer 410a in the cell area CA. A first silicon layer 410c and a second insulating layer 410d may be formed on the first insulating layer 410a and on the peripheral gate insulating layer 410b.

Referring to FIG. 3C, a bit line contact hole 402 may be formed. The bit line contact hole 402 may be formed by forming a first photoresist pattern 404 and partially removing the second insulating layer 410d, the first silicon layer 410c, and the first insulating layer 410a using the first photoresist pattern 404 as a patterning mask. After patterning, the first photoresist pattern 404 may be removed.

Referring to FIG. 3D, a second silicon layer 410e may be formed on the entire surface of the substrate 110. The second silicon layer 410e may be deposited to a sufficient thickness to fill the bit line contact hole 402.

Referring to FIG. 3E, the second silicon layer 410e may be partially removed by etch back. The etch back may be performed in two steps. First, the second silicon layer 410e may be partially removed to expose the second insulating layer 410d. The second insulating layer 410d may be removed to expose the first silicon layer 410c. Here, the exposed surface of the second silicon layer 410e may be disposed at the same level as or a lower level than the surface of the first silicon layer 410c.

Referring to FIG. 3F, a lower metal silicide layer 430a, a barrier layer 430b, an upper metal silicide layer 430c, an electrode layer 430d, and a hard mask layer 450 may be formed, e.g., sequentially, on the entire surface of the substrate 110 by deposition.

Referring to FIG. 3G, the hard mask layer 450 (of FIG. 3F) may be patterned. The hard mask layer 450 may be patterned to form a cell hard mask pattern 352 and a peripheral hard mask pattern 452 by common photolithography and etching. For example, a second photoresist pattern (not shown) may be formed on the hard mask layer 450, and used as a patterning mask to complete the hard mask patterns 352 and 452. The electrode layer 430d, the upper metal silicide layer 430c, the barrier layer 430b, the lower metal silicide layer 430a, the second silicon layer 410e, the first silicon layer 410c and the first insulating layer 410a may be selectively removed using the hard mask patterns 352 and 452 as etch masks.

The first bit line conductive pattern 312, the second bit line conductive pattern 332, and the bit line hard mask pattern 352 may be formed in the cell area CA by patterning. In other words, the first bit line conductive pattern 312, the lower bit line metal silicide pattern 332a, the bit line barrier pattern 332b, the upper bit line metal silicide pattern 332c, the bit line electrode pattern 332d, and the bit line hard mask pattern 352 may be sequentially formed on the substrate 110 in the cell area CA. Also, the bit line contact plug 314, the lower bit line metal silicide pattern 332a, the bit line barrier pattern 332b, the upper bit line metal silicide pattern 332c, the bit line electrode pattern 332d, and the bit line hard mask pattern 352 may be sequentially formed in the cell area CA in direct contact with the drain area 130b of the substrate 110.

In addition, the first peripheral gate conductive pattern 412, the second peripheral gate conductive pattern 432, and the peripheral gate hard mask pattern 452 may be formed in the peripheral area PA. In other words, the first peripheral gate conductive pattern 412, the lower peripheral gate metal silicide pattern 432a, the peripheral gate barrier pattern 432b, the upper peripheral gate metal silicide pattern 432c, the peripheral gate electrode pattern 432d, and the peripheral gate hard mask pattern 452 may be sequentially formed on the substrate 110 in the peripheral area PA.

Likewise, the bit line structures 300 in the cell area CA and the peripheral gate structures 400 in the peripheral area PA may be formed by simultaneously performing the processes of forming the bit line structure 300 in the cell area CA and the process of forming the peripheral gate structure 400 in the peripheral area PA. The bit line structures 300 may be formed to expose the cell isolation region 120, the cell active region 130 and the cell gate structure 200. The peripheral gate structure 400 may be formed to expose the peripheral isolation region 122 and the peripheral active region 132.

Figure 3H:
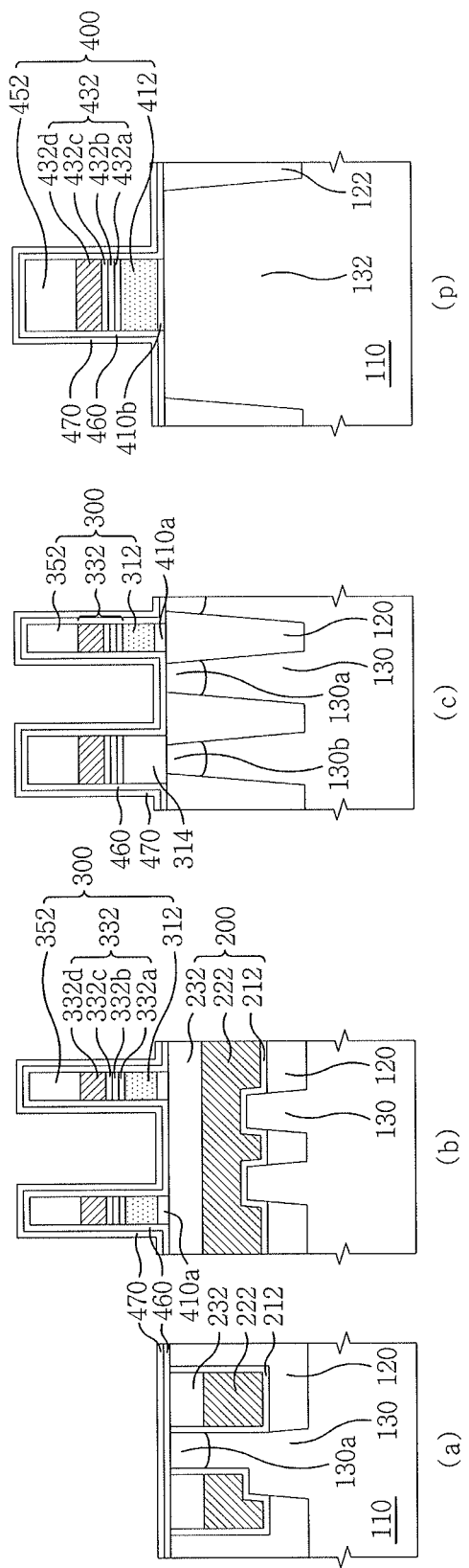

Referring to FIG. 3H, a surface protective layer 460 may be formed on both the cell area CA and the peripheral area PA. The surface protective layer 460 may be formed of, e.g., a silicon oxide layer. The surface protective layer 460 may be formed, e.g., conformally, on the bit line structure 300 in the cell area CA and on the peripheral gate structure 400 in the peripheral area PA to have a predetermined thickness. The surface protective layer 460 may be formed of an oxide layer formed by selective oxidation to cure damage to silicon caused by the above-described etching. Thus, the surface protective layer 460 may be formed around the first bit line conductive pattern 312 formed of at least a doped silicon layer.

Subsequently, a first offset insulating layer 470 may be formed in both the cell area CA and the peripheral area PA, e.g., the first offset insulating layer 470 may be formed conformally on the surface protective layer 460. The first offset insulating layer 470 may be formed of, e.g., a nitride layer by CVD. For example, the first offset insulating layer 470 may be formed of, e.g., a silicon nitride (SiN) layer or a silicon oxynitride (SiON) layer. The first offset insulating layer 470 may be formed of a silicon nitride (SiN) layer having a high etch selectivity with respect to the silicon layer. The first offset insulating layer 470 may serve to protect the second bit line conductive pattern 332 of the bit line structure 300. The first offset insulating layer 470 may be deposited to a minimal thickness to protect the bit line structure 300. The first offset insulating layer may be deposited to a thickness of at about 10 Å to about 60 Å. As the thickness of the first offset insulating layer 470 is reduced, the bit line parasitic capacitance (CBL) may be reduced.

Figure 3I:
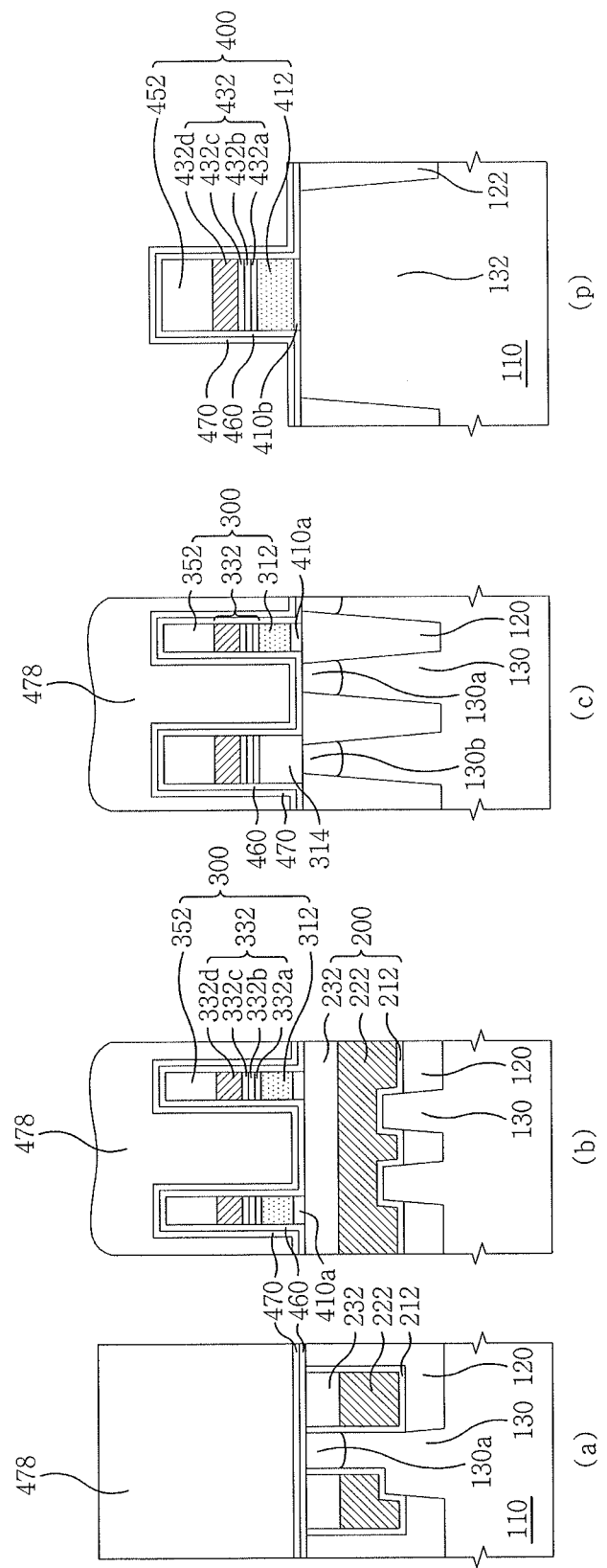

Referring to FIG. 3I, a peripheral area opening mask 478 covering the cell area CA and opening the peripheral area PA may be formed. First, an oxide layer (not shown) may be formed on the first offset insulating layer 470 in the cell area CA and the peripheral area PA. The oxide layer may be a middle temperature oxide (MTO) layer. A third photoresist pattern (not shown) opening the peripheral area PA may be formed by photolithography. An oxide layer pattern may be formed using the third photoresist pattern as an etch mask, so the peripheral area opening mask 478 may be completed. Here, wet etching may be used. Since the cell area CA is covered with the peripheral area opening mask 478, elements of the cell area CA under the peripheral area opening mask 478 may not be influenced from a subsequent process.

Figure 3J:
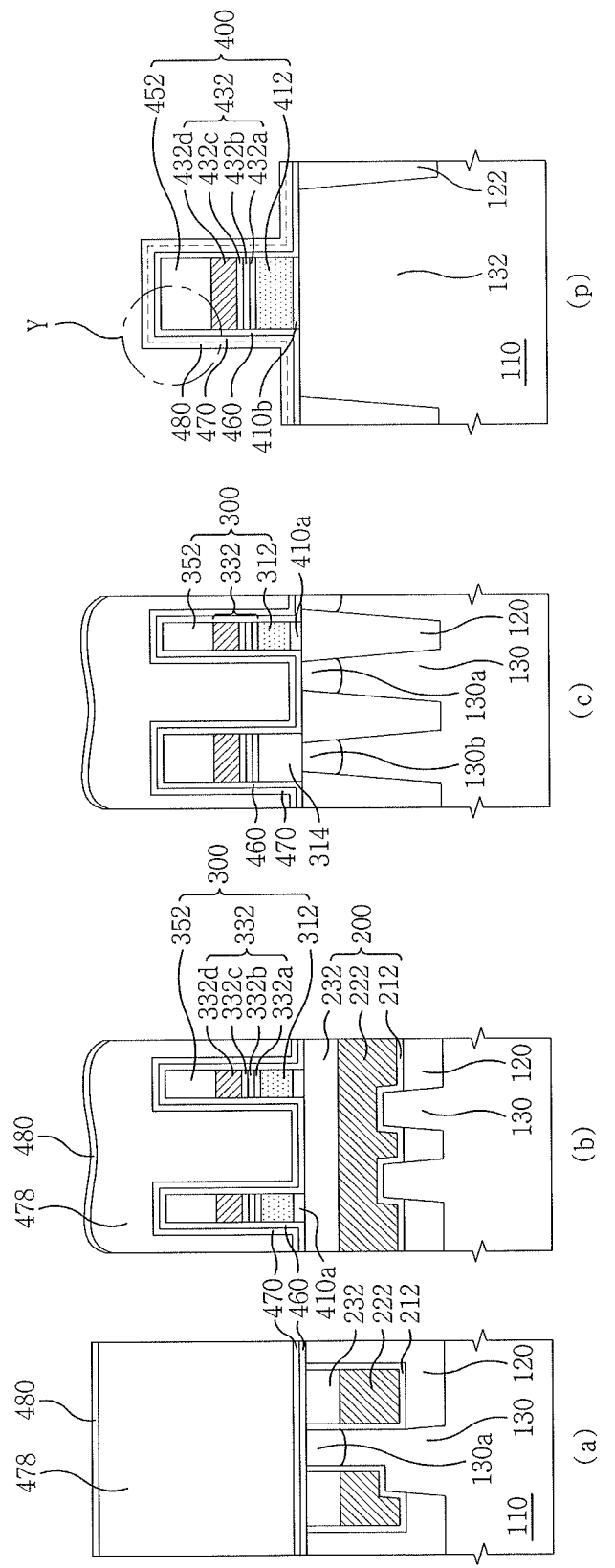

Referring to FIG. 3J, a second offset insulating layer 480 may be formed in the peripheral area PA. The second offset insulating layer 480 may be formed of a nitride layer, e.g., SiN or SiON, by CVD. Since the peripheral area opening mask 478 is formed in the cell area CA, the second offset insulating layer 480 may not be deposited on the first offset insulating layer 470 in the cell area CA. Thus, while a single insulating layer, i.e., the first offset insulating layer 470, is formed on the bit line structure 300 in the cell area CA, a double insulating layer, i.e., the first offset insulating layer 470 and the second offset insulating layer 480, may be formed on the peripheral gate structure 400 in the peripheral area PA. In other words, the thicknesses of the double insulating layer, i.e., the offset insulating layers 470 and 480, formed on the peripheral gate structure 400 in the peripheral area PA may be greater than that of the single insulating layer, i.e., the offset insulating layer 470, formed on the bit line structure 300 in the cell area CA.

Determination of the thickness of the first and second offset insulating layers 470 and 480 will be explained with reference to FIGS. 3T and 3U. FIGS. 3T and 3U illustrate vertical cross-sectional views of an enlarged part Y of FIG. 3J to illustrate various methods of fabricating a semiconductor device.

Referring to FIGS. 3T and 3U, a thickness T2 of the second offset insulating layer 480 may be determined by a thickness T1 of the first offset insulating layer 470. While the first and second offset insulating layers 470 and 480 may generally have uniform thicknesses due to the characteristics of the CMOS transistor, when a total thickness T of the double layer is determined, a thickness ratio (T1:T2) of the first offset insulating layer 470 to the second offset insulating layer 480 may be variable within the thickness ranges of the respective layers. For example, an increase in the thickness T1 of the first offset insulating layer 470 may cause a decrease in the thickness T2 of the second offset insulating layer 480 in order to maintain a same total thickness T, i.e., a constant value of T1+T2, and vice versa. For example, when the first offset insulating layer 470 is formed to a thickness of about 60 Å, the second offset insulating layer 480 may also be formed to a thickness of about 60 Å, and when the first offset insulating layer 470 is formed to a thickness of about 60 Å or less, the second offset insulating layer 480 may be formed to a thickness of about 60 Å or more. However, in comparison to the thickness t2 (in FIGS. 2B and 2C) of the second peripheral gate offset spacer 482, the thickness T2 of the second offset insulating layer 480 may be greater than the thickness t2 in consideration of a subsequent etching.

Figure 3K:
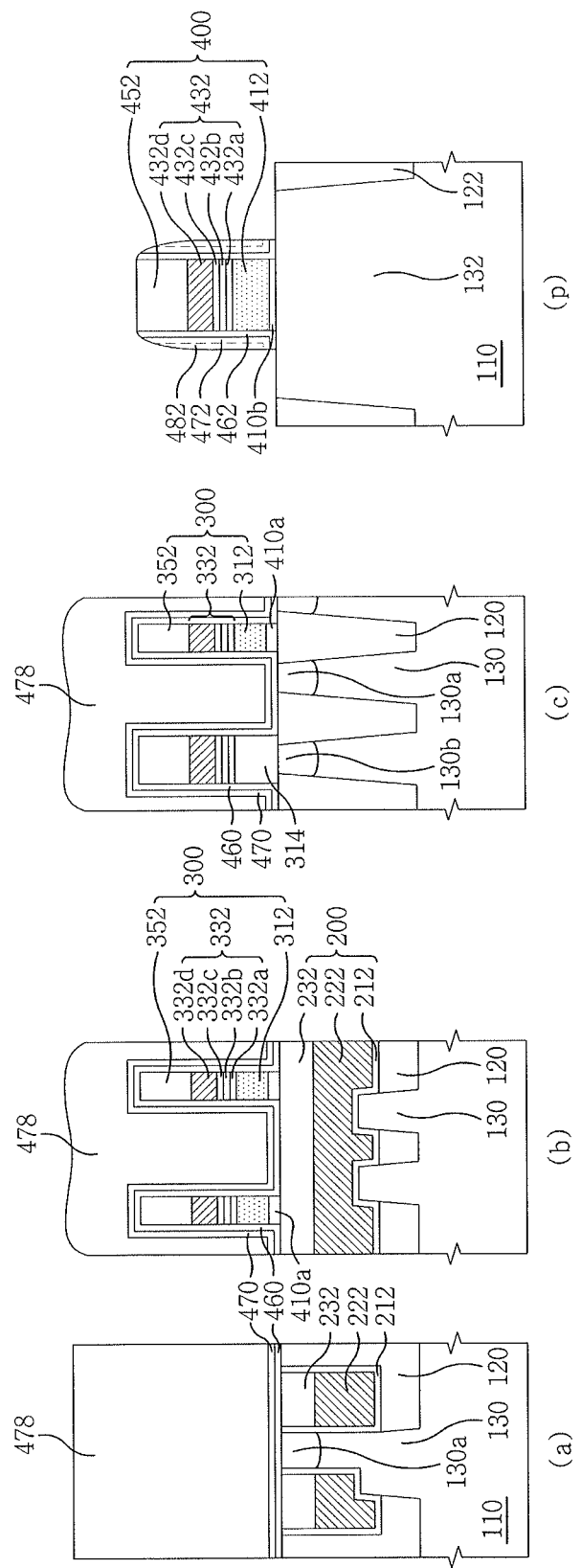

Referring to FIG. 3K, the surface protective layer 460 (of FIG. 3J), and the first and second offset insulating layers 470 and 480 (of FIG. 3J) in the peripheral area PA may be selectively removed by dry etching to form the peripheral gate protective spacer 462, and the first and second peripheral gate offset spacers 472 and 482, respectively. Afterwards, the final thicknesses of the first and second peripheral gate offset spacers 472 and 482 may be determined by wet etching using a silicon layer as an etch stopper (barrier). The thickness t2 (of FIGS. 2B-2C) of the second peripheral gate offset spacer 482 remaining on both sides of the peripheral gate structure 400 may be controlled by determining the degree of the wet etching. At this time, when the first peripheral gate offset spacer 472 and the second peripheral gate offset spacer 482 are formed of the same material, an interface may not be formed between the first and second offset spacers 472 and 482. However, when the first peripheral gate offset spacer 472 and the second peripheral gate offset spacer 482 are formed of different materials, an interface may be formed therebetween (dotted line in FIG. 3K). The first and second peripheral gate offset spacers 472 and 482 may be used as low concentration and/or hollow ion implantation masks in a subsequent ion implantation process.

Figure 3L:
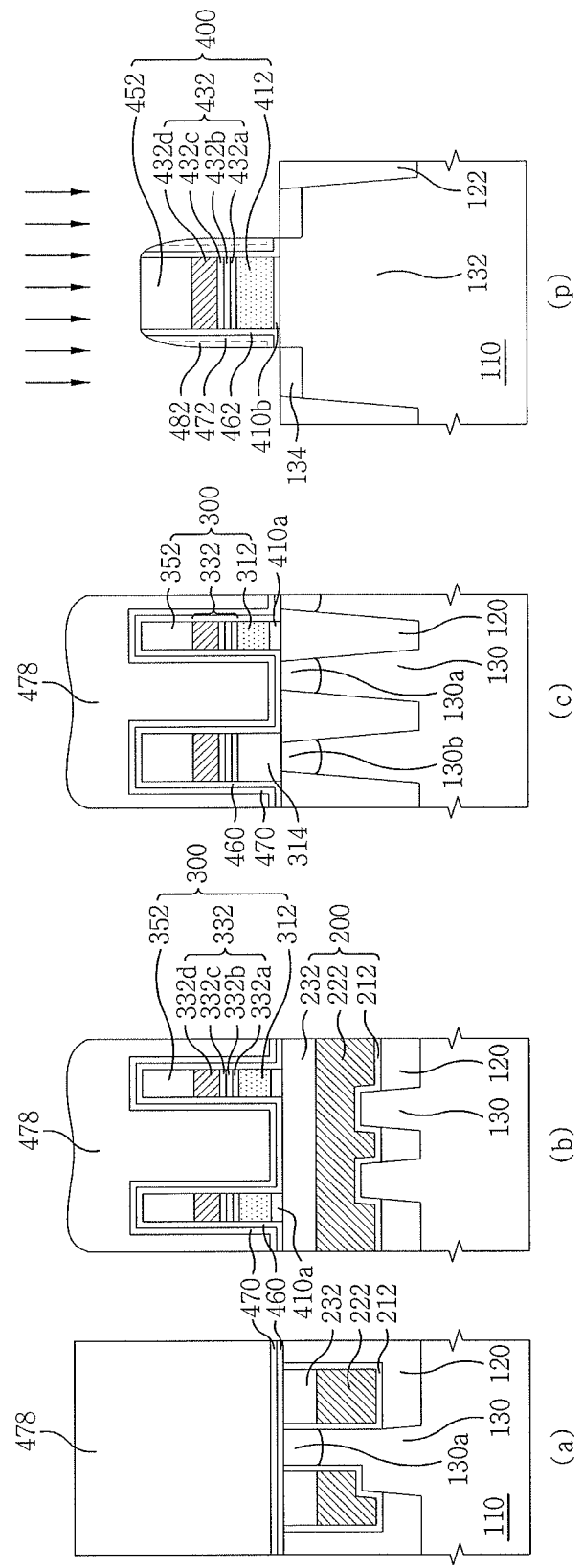
Figure 3M:
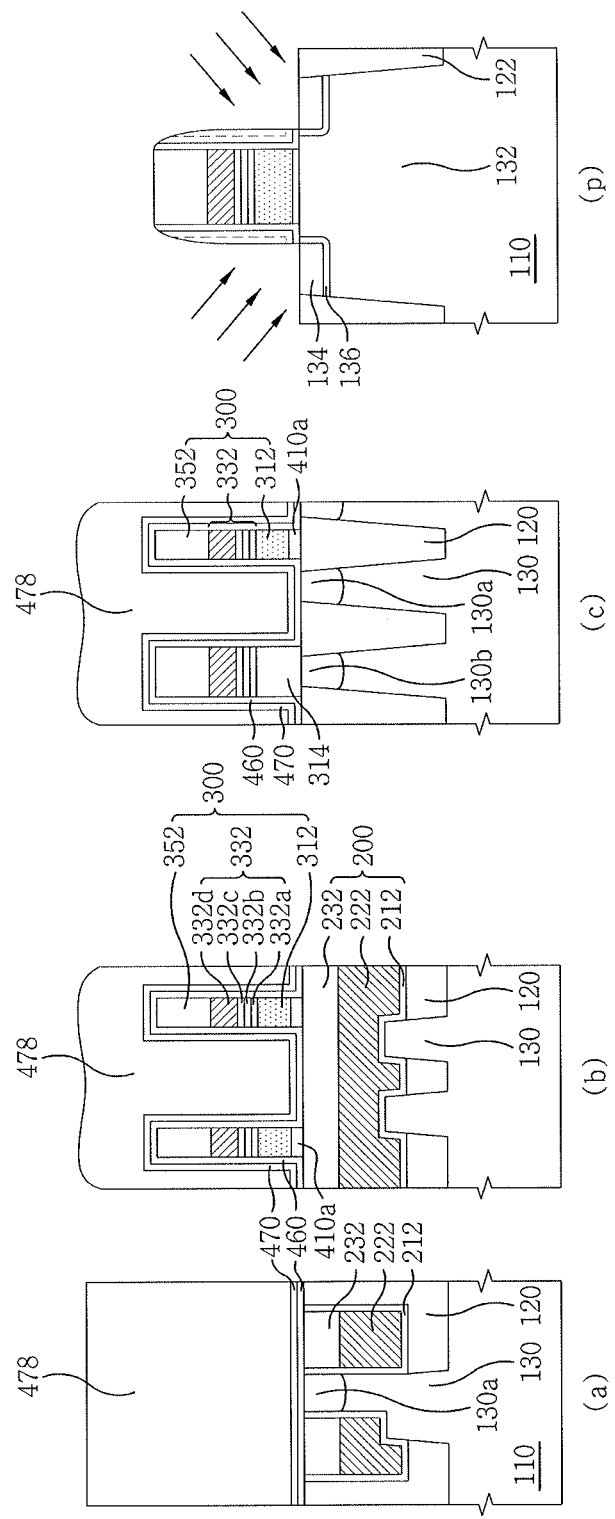

Referring to FIGS. 3L and 3M, hollow ion implantation may be performed on the active region 132 in the peripheral area PA using the first and second peripheral gate offset spacers 472 and 482 as ion implantation masks. Here, the second peripheral gate offset spacer 482 may serve to reduce lateral diffusion of impurities implanted into a peripheral active region 132 adjacent to the peripheral gate structure 400, such that the short channel effect can be improved.

First, referring to FIG. 3L, low concentration impurity ion implantation may be performed using the first and second peripheral gate offset spacers 472 and 482 and the peripheral gate structure 400 as ion implantation masks. When the peripheral gate structure 400 is included in a PMOS transistor, P-type impurities may be implanted to form a low concentration P-type impurity area 134. On the other hand, when the peripheral gate structure 400 is included in an NMOS transistor, N-type impurities may be implanted to form a low concentration N-type impurity area 134.

Referring to FIG. 3M, hollow ion implantation may be performed using the first and second peripheral gate offset spacers 472 and 482 and the peripheral gate structure 400 as ion implantation masks. When the peripheral gate structure 400 is included in a PMOS transistor, N-type impurities may be implanted to form an N-type hollow area 136. On the other hand, when the peripheral gate structure 400 is included in an NMOS transistor, P-type impurities may be implanted to form a P-type hollow area 136. Since the hollow area 136 located on one side of the low concentration impurity area 134 has the same conductivity as and a higher concentration than the substrate 110, a depletion area can be prevented from being extended in the low concentration impurity area 134.

Figure 3N:
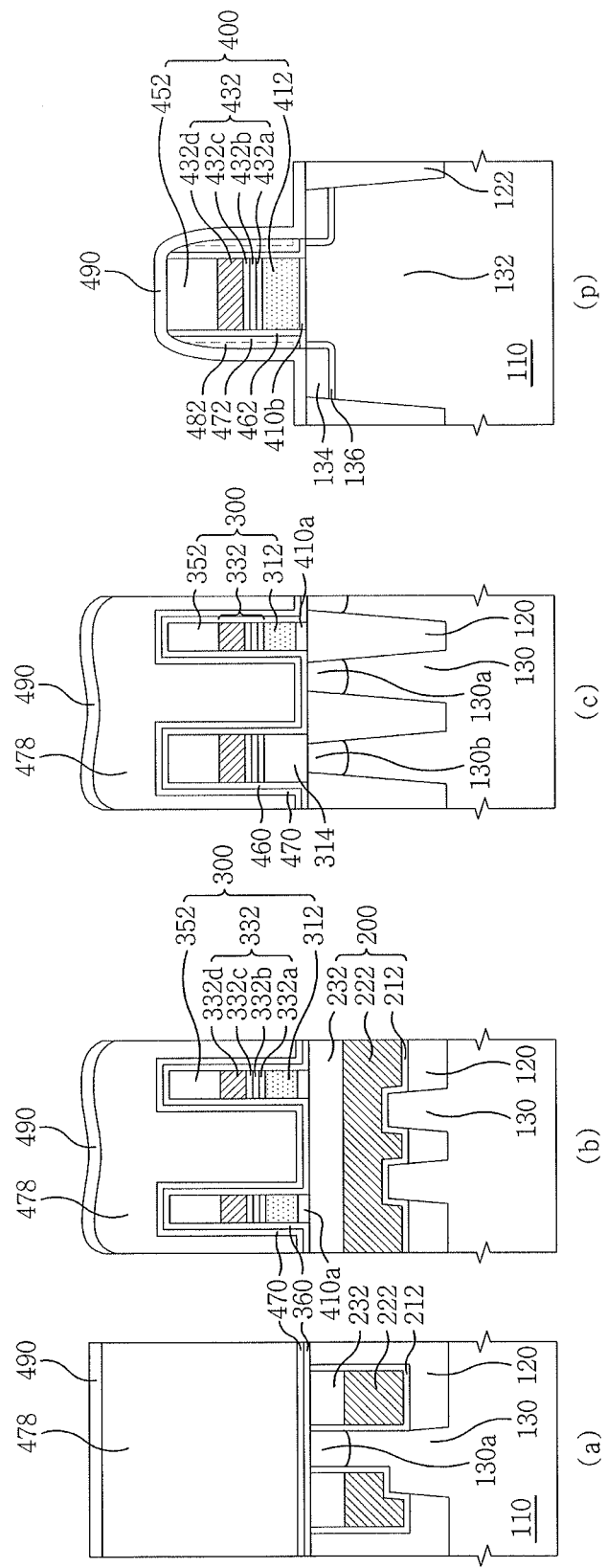
Figure 30:
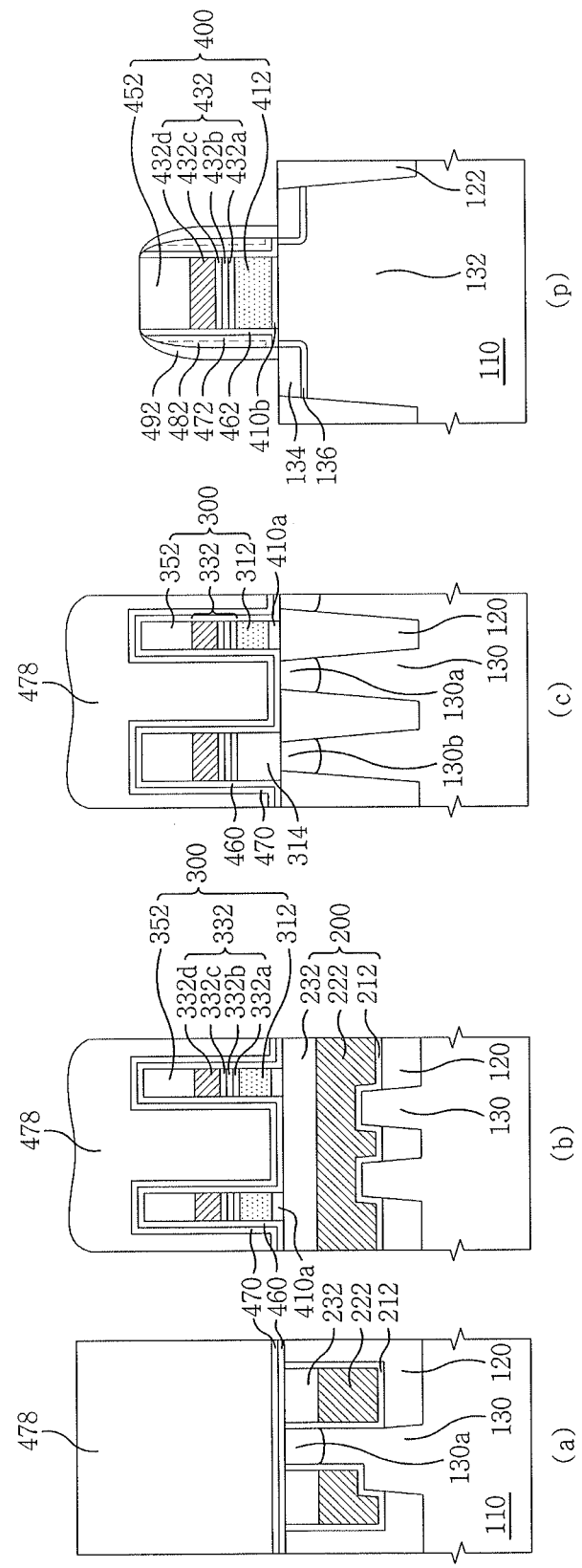

Referring to FIG. 3N, a spacer insulating layer 490 may be formed in the cell area CA and the peripheral area PA. The spacer insulating layer 490 may have an etch selectivity with respect to the second peripheral gate offset spacer 482 and may be deposited by CVD. For example, when the second peripheral gate offset spacer 482 is formed of a silicon nitride layer, the spacer insulating layer 490 may be formed of an oxide layer.

Referring to FIG. 3O, the spacer insulating layer 490, e.g., the oxide layer, may be partially removed by dry etching to form the peripheral gate spacer 492 in the peripheral area PA. The peripheral gate spacer 492 may be formed by completely removing a portion of the oxide layer formed on the upper surface of the peripheral gate structure 400 and partially removing the remaining portion of the oxide layer formed on the side of the peripheral gate structure 400. The final thickness of the peripheral gate spacer 492 may be determined by wet etching. For example, the thickness of the peripheral gate spacer 492 remaining on both sides of the second peripheral gate offset spacer 482 may be controlled by determining the degree of the wet etching.

Figure 3P:
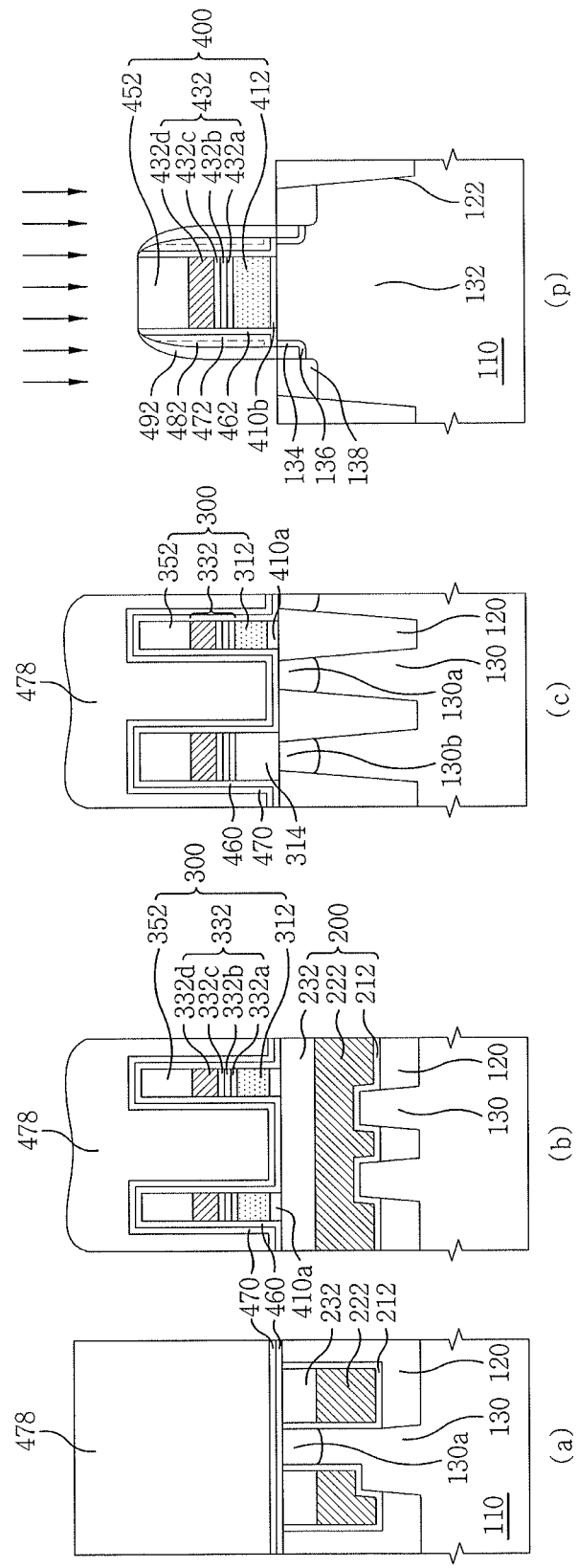

Referring to FIG. 3P, high concentration impurity ion implantation may be performed using the peripheral gate spacer 492 and the peripheral gate structure 400 as ion implantation masks. As a result, the high concentration impurity area 138 may be formed outside the low concentration impurity area 134. For example, when the peripheral gate structure 400 is included in a PMOS transistor, P-type impurities may be implanted to form a high concentration P-type impurity area 138. On the other hand, when the peripheral gate structure 400 is included in an NMOS transistor, N-type impurities may be implanted to form a high concentration N-type impurity area 138.

Figure 3Q:
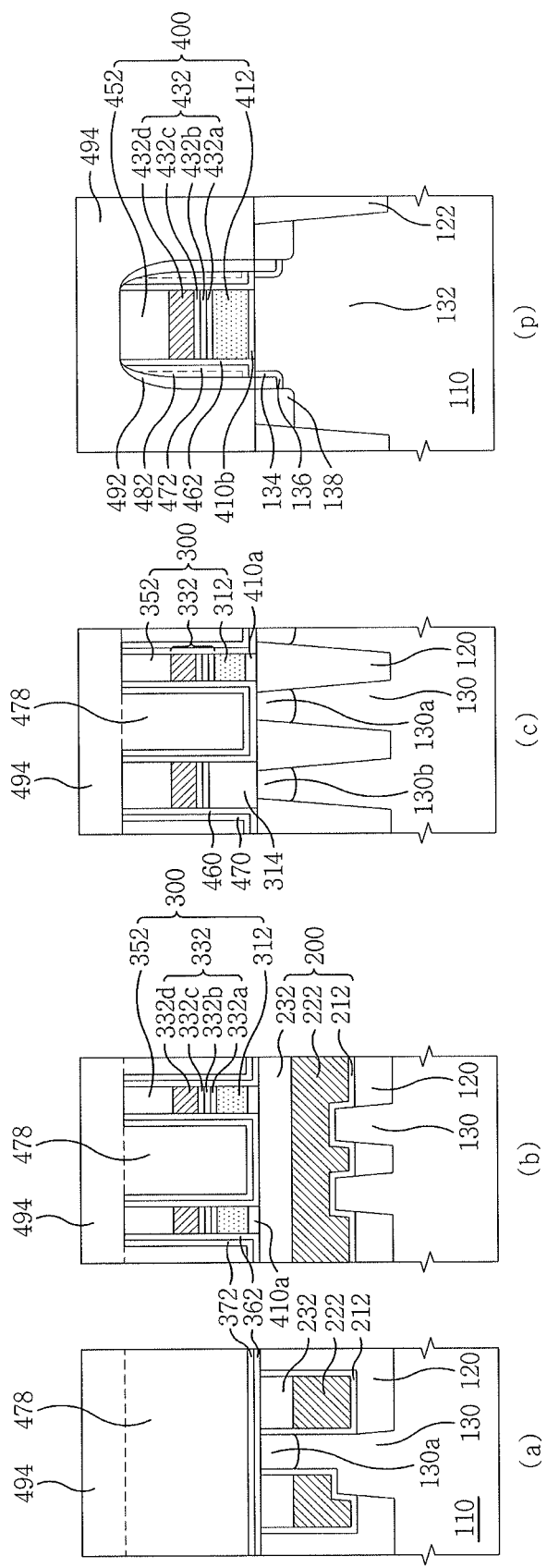

Referring to FIG. 3Q, an interlayer insulating layer 494 covering the cell area CA and the peripheral area PA may be formed. For example, the peripheral area opening mask 478 in the cell area CA may be partially removed by planarization. Here, the planarization may be performed until the bit line hard mask pattern 352 is exposed. An oxide layer may be deposited again on the cell area CA and the peripheral area PA. Here, the deposited oxide layer may be the same as that for the peripheral area opening mask 478. In other words, the interlayer insulating layer 494 may be formed to a predetermined thickness by partially removing the deposited oxide layer by planarization. In subsequent processes, the peripheral area opening mask 478 and the interlayer insulating layer 494 may be considered to be formed of the same oxide layer, and thus they will be both shown as the interlayer insulating layer 494 without separation.

Figure 3R:
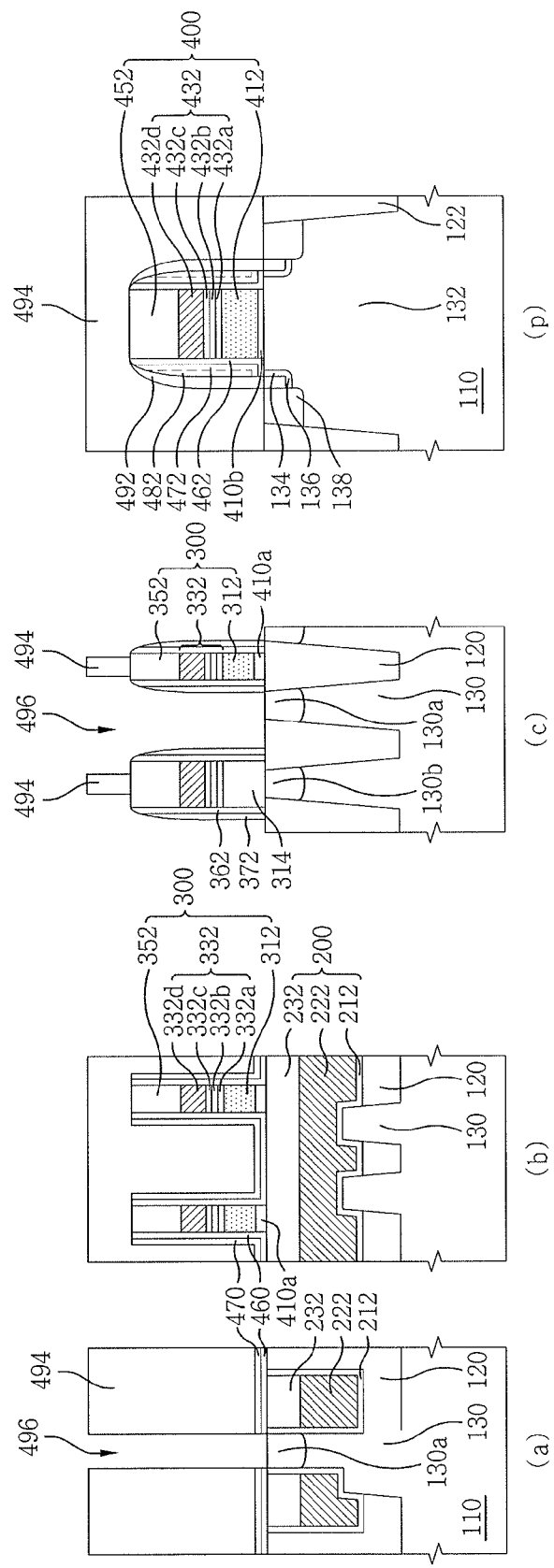
Figure 3S:
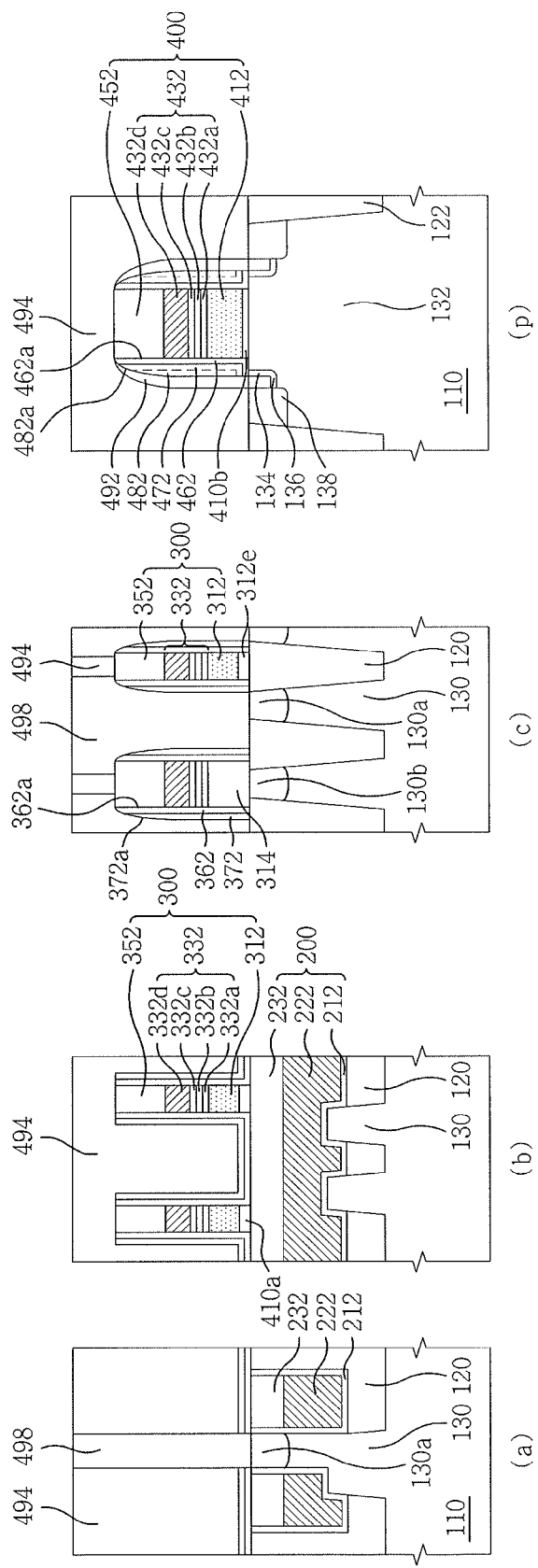
Figure 3T:
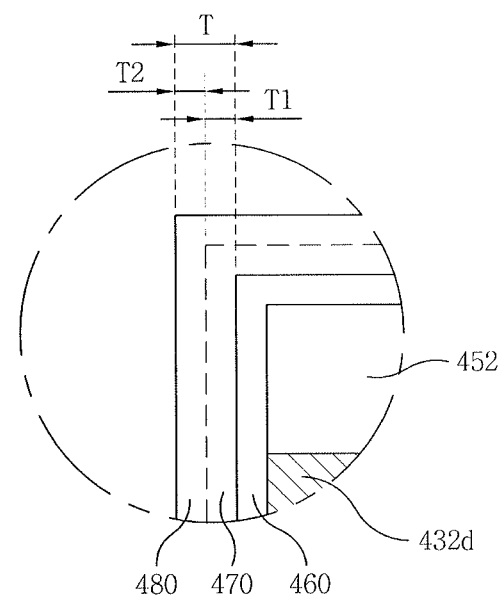
Figure 3U:
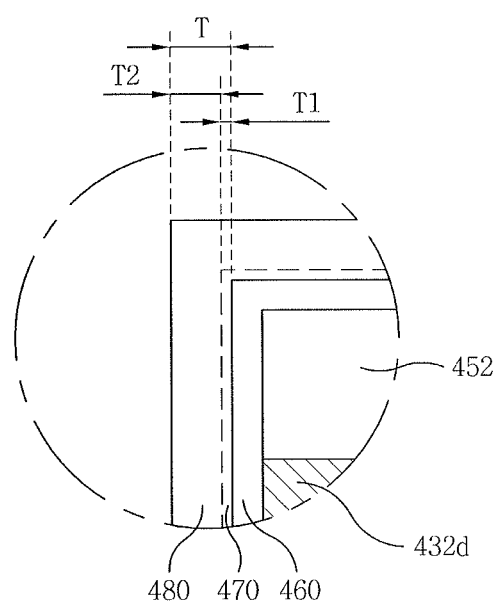

Referring to FIG. 3R, the interlayer insulating layer 494 in the cell area CA may be partially removed, thereby forming a storage contact hole 496 to form a storage contact BC. At this time, the surface protective layer 460 and the first offset insulating layer 470 may be partially removed to form the bit line surface protective spacer 362 and the first bit line offset spacer 372. The first bit line offset spacer 372 may serve as a self-alignment mask to self-align the storage contact hole 496.

Referring to FIG. 3S, the storage contact hole 496 may be filled with a conductive material and then planarized to form the storage contact BC 498.

Referring again to FIG. 2A, a cylinder-type storage electrode 500 may be formed on the storage contact BC 498 in the cell area CA.

Figure 4A:
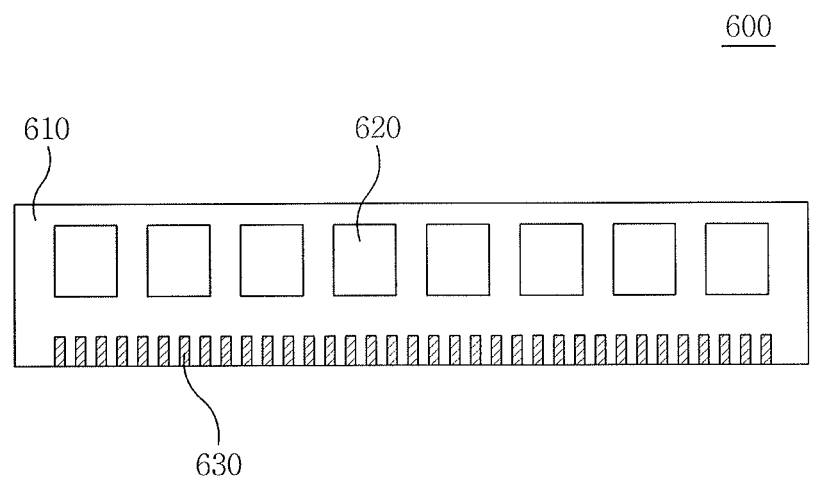
FIGS. 4A to 4C illustrate block diagrams of a semiconductor module, an electronic circuit board, and an electronic system including various semiconductor devices according to the inventive concept.

FIG. 4A is a schematic view of a semiconductor module including a semiconductor device according to the inventive concept. Referring to FIG. 4A, a semiconductor module 600, on which a semiconductor device according to an embodiment of the inventive concept is mounted, may include a module substrate 610, a plurality of semiconductor devices 620 disposed on the module substrate 610, and module contact terminals 630 formed in parallel at an edge of the module substrate 610 and in electrical contact with the semiconductor devices 620. The module substrate 610 may be a printed circuit board (PCB). Both sides of the module substrate 610 may be used. In other words, the semiconductor devices 620 may be disposed on both the top and the bottom of the module substrate 610. Additional semiconductor devices or other semiconductor devices for controlling semiconductor packages may be included. At least one of the semiconductor devices 620 may be the semiconductor device described above with reference to FIGS. 1-3U. The module contact terminal 630 may be formed of metal and have oxidation resistance. The module contact terminals 630 may be designed in various sizes according to the standard specifications for the semiconductor module 600.

Figure 4B:
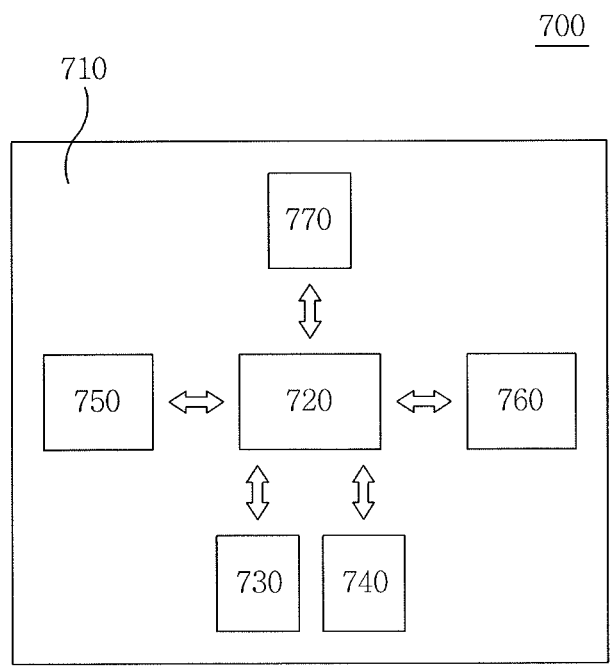

FIG. 4B is a schematic block diagram of an electronic circuit board including a semiconductor device according to the inventive concept. Referring to FIG. 4B, an electronic circuit board 700 according to an embodiment of the inventive concept may include a microprocessor 720 disposed on a circuit board 710, a main storage circuit 730 and a supplementary storage circuit 740, which are in communication with the microprocessor 720, an input signal processing circuit 750 sending a command to the microprocessor 720, an output signal processing circuit 760 receiving a command from the microprocessor 720, and a communicating signal processing circuit 770 sending and receiving electrical signals to and from other circuit boards. Arrows can be understood as referring to paths capable of delivering electrical signals.

The microprocessor 720 may process received electrical signals, output the processing result, and control other components of the electronic circuit board 710. The microprocessor 720 may be a central processing unit (CPU) and/or a main control unit (MCU).

The main storage circuit 730 may temporarily store data always or frequently required to the microprocessor 720 or data before or after processing. The main storage circuit 730 needs a fast response speed, and thus may include a semiconductor memory. The main storage circuit 730 may include a semiconductor memory called a cache. For example, the main storage circuit 730 may include a static random access memory (SRAM), a dynamic random access memory (DRAM), a resistive random access memory (RRAM), an application semiconductor memory, e.g., a utilized RAM, a ferroelectric RAM, a fast cycle RAM, a phase changeable RAM, a magnetic RAM, etc. Further, the main storage circuit 730 may not be dependent on volatility or non-volatility, and may include a random access memory. In the embodiment, the main storage circuit 730 may include at least one semiconductor deviceaccording to the inventive concept or at least one semiconductor module 600 including the at least one semiconductor device.

The supplementary storage circuit 740 is a large capacitance storage device, for example, a non-volatile semiconductor memory such as a flash memory, a hard disk drive using a magnetic field, or a compact disk drive using light. The supplementary storage circuit 740 may be used when a fast response speed is not required but large capacity data storage is required, compared to the main storage circuit 730. The supplementary storage circuit 740 does not depend on randomness, and may include a non-volatile memory. The supplementary storage circuit 740 may include at least one semiconductor device according to the inventive concept or at least one semiconductor module 600 including the at least one semiconductor device.

The input signal processing circuit 750 may change an external command into an electrical signal, or deliver the electrical signal from outside to the microprocessor 720. The command or electrical signal delivered from outside may be an operating command or electrical signal to be treated, or data to be stored. The input signal processing circuit 750 may be a terminal signal processing circuit processing a signal received from a keyboard, a mouse, a touch pad, an image recognizing device or various sensors, an image signal processing circuit processing an input image signal of a scanner or camera, a sensor interface or an input signal interface. The input signal processing circuit 750 may include at least one semiconductor device according to the inventive concept or at least one semiconductor module 600 including the at least one semiconductor device.

The output signal processing circuit 760 may be a component for transmitting the electrical signal processed by the microprocessor 720 to the outside. For example, the output single processing circuit 760 may be, e.g., a graphic card, an image processor, an optical transducer, a beam panel card, or an interface circuit having various functions. The output signal processing circuit 760 may include at least one semiconductor device according to the inventive concept or at least one semiconductor module 600 including the at least one semiconductor device.

The communication circuit 770 is a component for directly sending and receiving an electrical signal to and from another electronic system or a different circuit board not via the input signal processing circuit 750 or output signal processing circuit 760. For example, the communication circuit 770 may be, e.g., a modem, a LAN card, or various interface circuits in a personal computer system. The communication circuit 770 may include at least one semiconductor device according to the inventive concept or at least one semiconductor module 600 including the at least one semiconductor device.

Figure 4C:
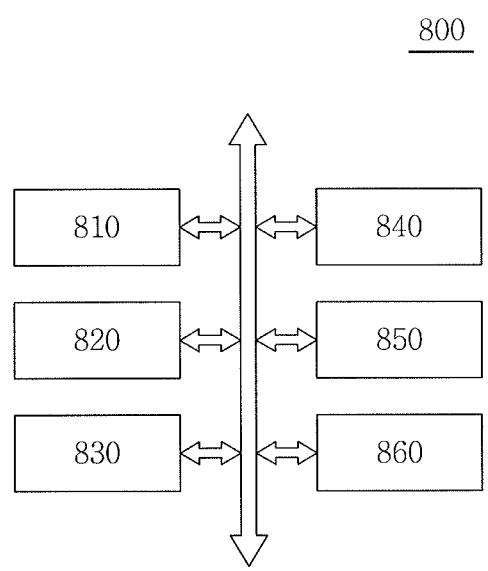

FIG. 4C is a schematic block diagram of an electronic system including a semiconductor device according to an embodiment of the inventive concept and the semiconductor module including the semiconductor device. Referring to FIG. 4C, an electronic system 800 according to the embodiment of the inventive concept may include a control unit 810, an input unit 820, an output unit 830, and a storage unit 840, and may further include a communication unit 850 and/or an operation unit 860.

The control unit 810 may control the electronic system 800 and all of the units. The control unit 810 may be considered as a central processing unit or central control unit, and may include the electronic circuit board 700 according to the embodiment of the inventive concept. The control unit 810 may include at least one semiconductor device according to the inventive concept or at least one semiconductor module 600 including the at least one semiconductor device.

The input unit 820 may send an electrical command signal to the control unit 810. The input unit 820 may be an image recognizer such as a keyboard, a key pad, a mouse, a touch pad, or a scanner, or another input sensor. The input unit 820 may include at least one semiconductor device according to the inventive concept or at least one semiconductor module 600 including the at least one semiconductor device.

The output unit 830 may output the result obtained from the electronic system 800 by processing an electrical command signal received from the control unit 810. The output unit 830 may be a monitor, a printer, a beam projector, or various mechanical devices. The output unit 830 may include at least one semiconductor device according to the inventive concept or at least one semiconductor module 600 including the at least one semiconductor device.

The storage unit 840 may be a component for temporarily or permanently storing an electrical signal to be treated or that has been treated by the control unit 810. The storage unit 840 may be physically or electrically connected or linked to the control unit 810. The storage unit 840 may be a magnetic storage device such as a semiconductor memory or hard disk, an optical storage device such as a compact disk, or a server serving to store data. The storage unit 840 may include at least one semiconductor device according to the inventive concept or at least one semiconductor module 600 including the at least one semiconductor device.

The communication unit 850 may receive an electrical command signal from the control unit 810 and send or receive an electrical signal to or from another electronic system. The communication unit 850 may be a wired transceiving device such as a modem or LAN card, a wireless transceiving device such as a WiBro interface, or an IR port. The communication unit 850 may include at least one semiconductor device according to the inventive concept or at least one semiconductor module 600 including the at least one semiconductor device.

The operation unit 860 may be physically or mechanically operated in response to the command of the control unit 810. For example, the operation unit 860 may be a mechanically operating component, such as a plotter, an indicator, or an up/down operator. The electronic system according to the inventive concept may be a computer, a network server, a networking printer, a scanner, a wireless controller, a terminal for mobile communication, an exchanger, or an electronic product performing a programmed operation.

Consequently, through a method of fabricating a semiconductor device according to the inventive concept, the following effects are expected. Since a bit line spacer includes a first offset insulating pattern, the thickness of the bit line spacer can be minimized, and the bit line parasitic capacitance can be reduced. In addition, since a peripheral gate spacer includes a first offset insulating pattern and a second offset insulating pattern, the thickness of the peripheral gate spacer can be maximized, and a short channel effect can be improved. As a result, electrical performances of a semiconductor module, an electronic circuit board, and an electronic system including the semiconductor device according to the inventive concept can be also improved.

Names and functions of the components not denoted by reference numerals or denoted by reference numerals but not described in the drawings will be easily understood with reference to the other drawings and descriptions of the specification.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
a substrate including a cell area and a peripheral area, the cell area having an active region defined by an isolation region;
a cell gate structure below an upper surface of the substrate in the cell area, the cell gate crossing the active region;
a bit line structure above an upper surface of the substrate in the cell area, the bit line structure including bit line offset spacers on at least two side surfaces thereof; and
a peripheral gate structure above an upper surface of the substrate in the peripheral area, the peripheral gate structure including peripheral gate offset spacers and peripheral gate spacers on at least two side surfaces thereof, a total number of spacer layers on the at least two side surfaces of the peripheral gate structures being larger than a total number of spacer layers on the at least two side surfaces of the bit line structure.

2. The device as claimed in claim 1, wherein the peripheral gate offset spacer is at least twice thicker than the bit line offset spacer.

3. The device as claimed in claim 2, wherein each of the bit line offset spacer and the peripheral gate offset spacer includes a silicon nitride (SiN) layer or a silicon oxynitride (SiON) layer, and the peripheral gate spacer includes a silicon oxide layer.

4. The device as claimed in claim 1, wherein:
the bit line structure includes a first bit line conductive pattern, a second bit line conductive pattern, and a bit line hard mask pattern, and
the peripheral gate structure includes a first peripheral gate conductive pattern, a second peripheral gate conductive pattern, and a peripheral gate hard mask pattern, the first bit line conductive pattern, the second bit line conductive pattern, and the bit line hard mask pattern including substantially the same materials to substantially the same thicknesses at substantially the same levels as the first peripheral gate conductive pattern, the second peripheral gate conductive pattern, and the peripheral gate hard mask pattern, respectively.

5. The device as claimed in claim 4, wherein:
each of the first bit line conductive pattern and the first peripheral gate conductive pattern includes a doped silicon layer,
each of the second bit line conductive pattern and the second peripheral gate conductive pattern includes a metal layer, and
each of the bit line hard mask pattern and the peripheral gate hard mask pattern includes a silicon nitride layer.

6. The device as claimed in claim 4, wherein the second bit line conductive pattern includes a bit line electrode pattern, and the second peripheral gate conductive pattern includes a peripheral gate electrode pattern.

7. The device as claimed in claim 6, wherein:
the second bit line conductive pattern further comprises a lower bit line metal silicide pattern, a bit line barrier pattern, and an upper bit line metal silicide pattern between the first bit line conductive pattern and the bit line electrode pattern, and
the second peripheral gate conductive pattern further comprises a lower peripheral gate metal silicide pattern, a peripheral gate barrier pattern, and an upper peripheral gate metal silicide pattern between the first peripheral gate conductive pattern and the peripheral gate electrode pattern.

8. A semiconductor device, comprising:
a substrate including a cell area and a peripheral area, the cell area having a plurality of cell active regions defined by cell isolation regions, and the peripheral area having a peripheral active region defined by a peripheral isolation region;
a bit line structure in the cell area of the substrate;
a peripheral gate structure in the peripheral area of the substrate;
first bit line offset spacers on at least two sides of the bit line structure;
first peripheral gate offset spacers on at least two sides of the peripheral gate structure;
second peripheral gate offset spacers on the at least two sides of the peripheral gate structure; and
peripheral gate spacers on the at least two sides of the peripheral gate structure.

9. The device as claimed in claim 8, wherein each of the first peripheral gate offset spacer and the second peripheral gate offset spacer includes a silicon nitride-based layer, and the peripheral gate spacer includes a silicon oxide-based layer.

10. The device as claimed in claim 8, wherein a sum of thicknesses of the first peripheral gate offset spacer and the second peripheral gate offset spacer is substantially uniform, and a thickness ratio of the first peripheral gate offset spacer to the second peripheral gate offset spacer is variable.

11. The device as claimed in claim 10, wherein a thickness of the first peripheral gate offset spacer is determined in accordance with a thickness of the first bit line offset spacer.

12. The device as claimed in claim 10, wherein a thickness of the first bit line offset spacer is about 10 Å to about 60 Å.

13. The device as claimed in claim 12, wherein a thickness of the second peripheral gate offset spacer is about 60 Å to about 110 Å.

14. The device as claimed in claim 8, wherein:
the bit line structure includes a first bit line conductive pattern, a second bit line conductive pattern, and a bit line hard mask pattern, the second bit line conductive pattern including, sequentially stacked, a lower bit line metal silicide pattern, a bit line barrier pattern, an upper bit line metal silicide pattern, and a bit line electrode pattern, and
the peripheral gate structure includes a first peripheral gate conductive pattern, a second peripheral gate conductive pattern, and a peripheral gate hard mask pattern, the second peripheral gate conductive pattern including, sequentially stacked, a lower peripheral gate metal silicide pattern, a peripheral gate barrier pattern, an upper peripheral gate metal silicide pattern, and a peripheral gate electrode pattern.

15. The device as claimed in claim 14, wherein the lower bit line metal silicide pattern, the bit line barrier pattern, the upper bit line metal silicide pattern, and the bit line electrode pattern include substantially the same materials to substantially the same thicknesses at substantially the same levels as the lower peripheral gate metal silicide pattern, the peripheral gate barrier pattern, the upper peripheral gate metal silicide pattern, and the peripheral gate electrode pattern, respectively.

16. A semiconductor device, comprising:
a substrate including a cell area and a peripheral area;
a bit line structure in the cell area, the bit line structure including first external sidewalls;
a bit line spacer on the first external sidewalls;
a peripheral gate structure in the peripheral area, the peripheral gate structure including second external sidewalls; and
a peripheral spacer on the second external sidewalls, the peripheral spacer being thicker than the bit line spacer, and the peripheral spacer including more spacer layers than the bit line spacer.

17. The device as claimed in claim 16, wherein:
the bit line spacer includes a first surface contacting the first external sidewall of the bit line structure and a second surface contacting an interlayer insulating layer covering the bit line structure,
the peripheral spacer includes a first surface contacting the second external sidewall of the peripheral gate structure and a second surface contacting an interlayer insulating layer covering the peripheral gate structure, and
a thickness of each of the bit line and peripheral spacers is measured between respective first and second surfaces.

18. The device as claimed in claim 16, further comprising an insulating layer on the substrate, a bottom of the peripheral gate structure and a bottom of the bit line structure being directly on the insulating layer, and the peripheral gate structure and the bit line structure extending in a same direction.

19. The device as claimed in claim 16, wherein:
the bit line spacer includes at least a first spacer layer and a second spacer layer,
the peripheral spacer includes at least a first spacer layer, a second spacer layer, and a third spacer layer, and
a sum of thicknesses of the second and third spacer layers of the peripheral spacer is at least twice as thick as a thickness of the second spacer layer of the bit line spacer.

* * * * *